(12) United States Patent
Miyakawa

(10) Patent No.: US 6,342,449 B2
(45) Date of Patent: *Jan. 29, 2002

(54) METHOD OF MANUFACTURING OF SEMICONDUCTOR DEVICE

(75) Inventor: Yasuhiro Miyakawa, Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/312,852

(22) Filed: May 17, 1999

(30) Foreign Application Priority Data

Jul. 21, 1998 (JP) .......................... 10-205658

(51) Int. Cl.[7] ..................... H01L 21/302; H01L 21/3065
(52) U.S. Cl. ....................... 438/692; 438/706; 438/723; 438/724; 438/740
(58) Field of Search ................................ 438/506, 723, 438/724, 740, 745, 756, 757, 692, 706

(56) References Cited

U.S. PATENT DOCUMENTS

| | | | |
|---|---|---|---|
| 4,060,427 A | * 11/1977 | Barlie et al. | 438/531 |
| 4,372,033 A | * 2/1983 | Chiao | 438/447 |
| 4,481,042 A | * 11/1984 | Takigawa et al. | 438/298 |
| 4,514,251 A | * 4/1985 | Van Ommen et al. | 438/526 |
| 4,839,302 A | * 6/1989 | Kameyama et al. | 438/350 |
| 5,096,843 A | * 3/1992 | Kodaira | 438/207 |

OTHER PUBLICATIONS

Hiyashi et al., "Mechanism of Highly Selective $SiO_2$ to $Si_3N_4$ Etching Using $C_4F_8$+CO Plasma" Proceedings of Symposium on Dry Process, 1996, pp. 135–140.
Hiyashi et al., "Characterization of Highly Selective SiO2/Si3N4 Etching of High–Aspect–Ratio Holes" Proceedings of Symposium on Dry Process, 1995, pp. 225–230.
Nippon Electric Co. [NIDE], Semiconductor integrated circuit production—involves implanting impurity ions into unmasked silicon nitride film to increase etching rate, English translation of JP 53045974 A, 2 pages, Apr. 1978.*

* cited by examiner

Primary Examiner—Benjamin L. Utech
Assistant Examiner—Lynette T. Umez-Eronini
(74) Attorney, Agent, or Firm—Venable; James R. Burdett; Paul F. Daebeler

(57) ABSTRACT

A technique for etching a silicon oxide film using a silicon nitride film as a stopper is provided so that a contact hole is opened in a self-aligned manner, etc., which corresponds to a semiconductor with a microstructure and a high aspect ratio. In a method of manufacturing a semiconductor device including an etching process for etching a silicon oxide film using a silicon nitride film as a stopper, atoms of one or more kinds selected from a group consisting of carbon and atoms whose reactivity to fluorine and oxygen is equivalent to that of carbon are implanted into said silicon nitride film by an ion implantation method before said etching process, so that selectivity of silicon oxide for silicon nitride in said etching process is increased.

21 Claims, 22 Drawing Sheets

METHOD OF MANUFACTURING OF SEMICONDUCTOR DEVICE

BACKGROUND OF THE INVENTION

1. Field of the Invention

This invention relates to a method of manufacturing a semiconductor device and, more particularly, to a method of manufacturing a semiconductor device which includes an etching process for etching a silicon oxide film using a silicon nitride film as a stopper.

2. Description of the Related Art

With the miniaturization of semiconductor devices, the dimensions of the structure of a semiconductor device such as the width of transfer gates and the dimensions of a contact hole are becoming smaller and smaller. In the reduction of the dimensions, it is difficult to reduce the dimension in the direction of the thickness at the same ratio as the reduction of the dimension in the transverse direction. Therefore, the aspect ratio, which is the ratio of the dimension in the direction of the thickness of the structure of the semiconductor device to the dimension in the direction of the width, has been increased instead. As the semiconductor device becomes more minute and the aspect ratio thereof is increased further, the depth of openings and grooves which must be formed by etching in the manufacturing of the semiconductor device becomes larger than the dimension in the transverse direction.

However, the etching methods available in the prior art are inevitably accompanied by the drawback that the stable formation of openings and grooves having a depth larger than the dimension in the transverse direction is difficult, which will be described hereinafter with reference to the following examples.

Firstly, a process to open a contact hole in a memory cell array portion in a dynamic random access memory chip (referred to as a DRAM chip, hereinafter) is taken as an example. The memory cell array portion and the contact hole are generally formed as shown in FIGS. 18 through 22. The following description is in accordance with FIGS. 18 through 22.

(a) As shown in FIG. 18, after isolation regions 502 are formed on a silicon substrate 501, transfer gates 504 stacked with an offset silicon oxide film 503 are formed by conventional lithography and etching. Subsequently, a mask pattern is formed by conventional lithography, and n-type impurities are implanted into the silicon substrate 501 by ion implantation. For simplification, the resist pattern at the time of the ion implantation is not illustrated.

(b) As shown in FIG. 19, a silicon oxide film is deposited on the whole surface of a wafer by chemical vapor deposition so as to be etched in an anisotropic manner to form side walls 505.

(c) As shown in FIG. 20, mask patterns a re formed by conventional lithography, and n-type impurities and p-type impurities are implanted into the silicon substrate 501 by ion implantation. For simplification, the resist patterns at the time of the ion implantation are not illustrated.

(d) As shown in FIG. 21, after a silicon oxide film 506 is deposited, a thick silicon nitride film 507, which functions as a stopper, is deposited. Subsequently, a silicon oxide film 508 is deposited so as to be planarized by chemical mechanical polishing.

(e) As shown in FIG. 22, a contact hole pattern 509 for opening a contact hole 510 on the silicon substrate 501 is formed by conventional lithography. Then, after the silicon oxide film 508 is etched using the silicon nitride film 507 as a stopper, the contact hole 510 is opened on the silicon substrate 501 by etching the silicon nitride film 507 and the silicon oxide film 506.

In the above-described process, the width of the side walls is set in such a way that the transfer gates of a peripheral circuit portion operate as desired. Here, a problem arises: as side walls with approximately the same width as those of the peripheral circuit portion are also formed in the memory cell array portion, the silicon nitride film deposits and buries most of the spaces between the transfer gates if the width of the silicon nitride film is set in such a way that the function thereof as a stopper is given priority, which causes the etching process of the silicon oxide film to be halted before the completion thereof. On the other hand, if priority is given to the complete etching of the silicon oxide film on the silicon nitride film so that the silicon nitride film is thinned, the function thereof as a stopper is depressed, resulting in short circuiting of the contact hole with the transfer gates.

Next, a process to open a metal wiring contact hole in a DRAM chip and a logic device is given as an example. In this process, a contact hole is formed by etching a silicon oxide film using a silicon nitride film as a stopper, which must be accompanied by high selectivity of silicon oxide for silicon nitride on the bottom of the deep contact hole. However, as is reported in "Characterization of Highly Selective $SiO_2/Si_3N_4$ Etching of High-Aspect-Ratio Holes" (Hisataka Hayashi, Kazuaki Kurihara and Makoto Sekine, Proceedings of Symposium on Dry Process, p. 225–230, 1995), under conditions of $C_4F_8/CO$ where high selectivity of silicon oxide for silicon nitride is ensured, a problem arises in that the etching rate is significantly lowered when the etching depth is increased, particularly in a fine contact hole. On the other hand, under conditions of $C_4F_8/CO/O_2$ where the etching rate is not lowered even in the fine contact hole, a problem arises in that sufficient selectivity of silicon oxide for silicon nitride can not be ensured. In other words, under the conditions of high selectivity, an opening can not be easily formed, yet under the conditions where a deep contact hole can be etched, wiring readily causes short circuiting because the silicon nitride film does not function as a stopper, thereby preventing stable opening of the contact hole.

In view of the above-described problems of the conventional techniques, the present invention provides a technique for etching a silicon oxide film using a silicon nitride film as a stopper so that a contact hole is opened in a self-aligned manner, etc., which corresponds to a semiconductor with a microstructure and a high aspect ratio.

SUMMARY OF THE INVENTION

In order to solve the aforementioned problems, the present invention provides a method of manufacturing a semiconductor device including an etching process for etching a silicon oxide film using a silicon nitride film as a stopper, wherein atoms of one or more kinds selected from a group consisting of carbon and atoms whose reactivity to fluorine and oxygen is equivalent to that of carbon are implanted into said silicon nitride film by an ion implantation method before said etching process, so that selectivity of silicon oxide for silicon nitride in said etching process is increased.

The atoms whose reactivity to fluorine and oxygen is equivalent to that of carbon may include atoms selected from a group consisting of boron, phosphorus, arsenic, and antimony.

It is preferable that the implantation of said atoms of one or more kinds into said silicon nitride film is conducted under the condition that the implantation dose of said atoms, which go beyond said silicon nitride film and reach a portion situated below said silicon nitride film, must be below the level at which the characteristics of that portion are affected.

More specifically, it is preferable that the implantation of said atoms of one or more kinds into said silicon nitride film is conducted not only after a silicon oxide film has been deposited on the silicon nitride film for planarization, but after the silicon oxide film has been etched with sufficiently high selectivity of silicon oxide for silicon nitride until the silicon nitride film on transfer gates has been exposed, that the implantation of said atoms of one or more kinds into said silicon nitride film is conducted after an organic film is formed on said silicon nitride film, and/or that the implantation of said atoms of one or more kinds into said silicon nitride film is conducted when a wafer having said silicon nitride film is inclined at a wider angle than the apparent angle of the incident ions viewed from said silicon nitride film. When said atoms of one or more kinds are atoms of one or more kinds selected from a group consisting of boron and carbon, said ion implantation method may be an ionization sputtering method.

The above etching process is preferably for forming a contact hole. Particularly, the process has an advantage when it is used to form a contact hole between the transfer gates of a semiconductor device having a plurality of transfer gates.

Hereinafter, the present invention will be described in detail.

According to the present invention, as selectivity of silicon oxide for silicon nitride in the etching process is increased, overetching of the silicon nitride film is prevented and the silicon nitride film is allowed to function fully as a stopper, even under the condition that the silicon oxide film can be etched to the surface of the silicon nitride film deposited on minute spaces between the transfer gates of a memory cell array portion and under the condition that a high etching rate is obtainable, such as the condition that the silicon oxide film can be etched to the surface of the silicon nitride film deposited as a stopper in a deep metal wiring contact hole. In other words, the selectivity of silicon oxide for silicon nitride can be compatible with the workability of the fine contact hole having a high aspect ratio.

The reason for the increased selectivity of silicon oxide for silicon nitride in the etching process by the implantation of the atoms specified above into the silicon nitride film can be explained as follows.

As reported in "Mechanism of Highly Selective $SiO_2$ to $Si_3N_4$ Etching Using $C_4F_8$+CO Plasma" (Hisataka Hayashi and Makoto Sekine, Proceedings of Symposium on Dry Process, p. 135–140, 1996), etching in the high selectivity of silicon oxide for silicon nitride is accomplished by scavenging fluorine that acts as an etchant of the silicon nitride film and a fluorocarbon polymer film using CO on a vapor phase and C supplied from CO on the surface of the silicon nitride film. It is considered that the atoms implanted into the silicon nitride film together with C supplied from the vapor phase contribute to the scavenging of fluorine, thereby allowing stable etching of the silicon oxide film using the silicon nitride film as a stopper, which is deposited on the minute spaces between the transfer gates of the memory cell array portion and on the bottom of the deep contact hole.

In other words, the above-described atoms are either carbon that scavenges fluorine, inhibits carbon supplied from the vapor phase from being removed by fluorine, and inhibits C around the surface of the silicon nitride film from being completely removed by CO or O which is generated from the silicon oxide film, or atoms whose reactivity to fluorine and oxygen is equivalent to that of carbon. The atoms which are equivalent to carbon have the dissociation energy for fluorine which is equivalent to the dissociation energy of carbon for fluorine, scavenge fluorine, and inhibit carbon supplied from the vapor phase from being removed by fluorine. Further, the atoms, whose dissociation energy for oxygen is high and whose oxides have low vapor pressure, combine easily with CO or O which is generated from the silicon oxide film, and inhibit C supplied to the silicon nitride film from the vapor phase and left around the surface of the silicon nitride film from being removed by O. The atoms that are equivalent to the carbon of this type include atoms whose dissociation energy for fluorine is from 400 to 800 kJ/mol, and whose dissociation energy for oxygen is 400 to 900 kJ/mol. Specifically, boron (whose dissociation energy for fluorine is 757 kJ/mol, and whose dissociation energy for oxygen is 808 kJ/mol), phosphorus (whose dissociation energy for fluorine is 439 kJ/mol, and whose dissociation energy for oxygen is 599.1 kJ/mol), arsenic (whose dissociation energy for fluorine is 410 kJ/mol, and whose dissociation energy for oxygen is 481 kJ/mol), and antimony (whose dissociation energy for fluorine is 439 kJ/mol, and whose dissociation energy for oxygen is 481 kJ/mol) may be included. Out of these atoms, a single atom may be used or 2 or more kinds may be combined.

The atoms specified above are referred to as the "scavenger atoms", hereinafter.

Any ion implantation method is appropriate as long as it is able to implant the scavenger atoms into the silicon nitride film. The implantation dose of the scavenger atoms does not have to be over the amount that is enough for the selectivity of silicon oxide for silicon nitride to increase, which a person skilled in the art can determine without difficulty.

The increased selectivity of silicon oxide for silicon nitride in the etching process is obtained by implanting the scavenger atoms into the silicon nitride film as described above. However, depending on the structure of the semiconductor device which is being manufactured, a problem may arise in that when the scavenger atoms are implanted into the silicon nitride, the implanted scavenger atoms go beyond the silicon nitride film and reach a portion situated below the silicon nitride film, thereby affecting the characteristics of that portion. Yet, the occurrence of the above-mentioned problem can be prevented by conducting the implantation of the scavenger atoms into the silicon nitride film under the condition that the implantation dose of said scavenger atoms, which go beyond said silicon nitride film and reach the portion situated below said silicon nitride film, must be below the level at which the characteristics of that portion is affected.

Therefore, in a preferable aspect of the present invention, a manufacturing method is presented wherein implantation of scavenger atoms into a silicon nitride film is conducted under the condition that an implantation dose of said scavenger atoms, which go beyond said silicon nitride film and reach a portion situated below said silicon nitride film, must be below the level at which the characteristics of that portion are affected (also referred to as the control implantation condition, hereinafter).

This type of control implantation condition can be set by appropriately regulating parameters such as ion accelerating energy in ion implantation.

Thus, as a further preferable aspect, the present invention provides a manufacturing method wherein implantation of scavenger atoms into a silicon nitride film is conducted not only after a silicon oxide film has been deposited on the silicon nitride film for planarization but after the silicon oxide film has been etched with sufficiently high selectivity of silicon oxide for silicon nitride until the silicon nitride film on transfer gates has been exposed, a manufacturing method wherein implantation of scavenger atoms into a silicon nitride film is conducted after an organic film is formed on said silicon nitride film, a manufacturing method wherein implantation of scavenger atoms into a silicon nitride film is conducted when a wafer having said silicon nitride film is inclined at a wider angle than the apparent angle of the incident ions viewed from said silicon nitride film, and a manufacturing method wherein an ion implantation method is an ionization sputtering method and scavenger atoms are one or more kinds of atom selected from a group consisting of boron and carbon.

In other words, the control implantation condition described above can be easily set by adopting any of the following (1) through (4), or adopting any combination of them.

(1) A silicon oxide film is deposited on a silicon nitride film for planarization, and the silicon oxide film is etched with sufficiently high selectivity of silicon oxide for silicon nitride until the silicon nitride film on transfer gates is exposed.

When a silicon oxide film is deposited on a silicon nitride film for planarization and the silicon oxide film is etched with sufficiently high selectivity of silicon oxide for silicon nitride until the silicon nitride film on transfer gates is exposed, implantation of ions into an unexposed silicon nitride film is restricted, thereby facilitating the setting of the control implantation condition.

(2) An organic film is formed on a silicon nitride film.

Materials of the organic film includes SWK-EX2 (a trade name, manufactured by TOKYO OHKA KOGYO). Formation methods of the organic film are not particularly restricted, one of which may be by dispensing. The thickness of the organic film is set together with the parameters such as the type of the scavenger atoms and the ion accelerating energy. The organic film restricts the projected range of ions of the scavenger atoms, thereby facilitating the setting of the control implantation condition.

The formation of the organic film is preferably conducted after the silicon oxide film has been deposited on the silicon nitride film for planarization and the silicon oxide film has been etched with sufficiently high selectivity of silicon oxide for silicon nitride until the silicon nitride film on the transfer gates has been exposed.

(3) A wafer is inclined at a wider angle than the apparent angle of the incident ions viewed from a silicon nitride film.

The apparent angle of the incident ions viewed from the silicon nitride film means a maximum inclination by which the incident ions can be irradiated to the bottom of grooves or openings (for example, $\theta$ in FIG. 7). By inclining the wafer in this manner, the distance for which the incident ions go through the silicon nitride film is extended, thereby facilitating the setting of the control implantation condition.

(4) Low energy I/I or ionization sputtering is used.

Normally, the ion accelerating energy of low energy I/I is not higher than approximately 10 keV. When the ion acceleration energy is low, the mean value and the standard deviation of the projected range of ions of the scavenger atoms are reduced, thereby facilitating the setting of the control implantation condition.

In the case of scavenger atoms where a target for an ionization sputtering method is easily obtainable, the atoms can be implanted by the ionization sputtering method. The atoms of this type include boron, carbon, and the like.

In the ionization sputtering method, it is possible to accelerate sputtering particles, which are ionized by plasma, by AC bias applied to an electrode installed on a wafer. When the AC bias is set in such a way that the maximum value of this accelerating energy is not higher than several keV, the ion accelerating energy in the ionization sputtering method can be set relatively low (for example, when the maximum value of the ion accelerating energy is set at not more than 1 keV, the projected range of ions is not more than several nm), thereby facilitating the setting of the control implantation condition.

The manufacturing methods of the present invention are preferably used for forming a contact hole. Particularly, according to the manufacturing methods of the present invention, grooves and openings with a high aspect ratio (whose depth is larger as compared to the width or the diameter) can be formed with stability by etching. Therefore, it is advantageous that the manufacturing methods of the present invention are used for forming a contact hole with a high aspect ratio, which is required particularly for a minute semiconductor device.

Further, in the manufacturing methods of the present invention, as the function of the silicon nitride film as a stopper is fully and stably utilized, it is advantageous that the semiconductor device which is being manufactured includes a plurality of transfer gates, between which a contact hole is formed. One of the example of the semiconductor devices having a plurality of transfer gates is a DRAM chip.

In the manufacturing methods of the present invention, any process used for the manufacturing methods of the semiconductor device can adopted as well as the process required for forming a contact hole. A manufacturing method of the semiconductor device including the following steps can be given as one of the examples.

(i) Transfer gates stacked with an offset silicon oxide film are formed.

(ii) After side walls are formed on the transfer gates with a silicon oxide film, a silicon nitride film, with a thickness that does not seal between the transfer gates at a point where the distance between the transfer gates is shortest, is deposited.

(iii) After a silicon oxide film is deposited and planarized, the silicon oxide film is etched with sufficiently high selectivity of silicon oxide for silicon nitride until the silicon nitride film on the transfer gates is exposed.

(iv) After an organic film is formed by dispensing, scavenger atoms are implanted into the silicon nitride film under the condition that the implantation dose of the scavenger atoms, which reach materials below the silicon nitride film, must be below the level at which the properties of the materials below the silicon nitride film are deteriorated.

(v) After an inter-layer insulating film is deposited, a contact hole is formed in a self-aligned manner under the condition that a minute contact hole can be etched with stability by using the silicon nitride film, into which the scavenger atoms are implanted, as a stopper.

The following step can substitute for the above step (ii). A silicon oxide film functioning as a protective film and a polycrystalline silicon film for forming side walls are sequentially deposited.

The side walls are formed by etching the polycrystalline silicon film in an anisotropic manner using the silicon oxide film as a stopper.

Source and drain regions of transfer gate transistors are formed by implanting n-type impurities and p-type impurities, respectively, making use of the side walls serving as a mask.

The side walls are etched in an isotropic manner using the silicon oxide film as a stopper.

A silicon nitride film, with a thickness that does not seal between the transfer gates, is deposited.

The methods of the present invention can be applied to a case where a contact hole is opened in a self-aligned manner using a silicon nitride film as a stopper, which exists along a bit line and like side walls on side walls of the bit line, in relation to a silicon substrate which exists below the bit line or to a pad connected electrically to the silicon substrate, such as a case of opening a capacitor electrode contact hole of a DRAM chip. As one of the examples, a manufacturing method including the following steps in addition to the above steps (i) through (v) can be given.

(vi) The contact hole formed in (v) is buried by polycrystalline silicon and a pad is formed by etchback.

(vii) After an inter-layer insulating film is deposited, a contact hole is formed in a self-aligned manner under the condition that a minute contact hole can be etched with stability using the silicon nitride film, into which the scavenger atoms are implanted, as a stopper.

(viii) After the contact hole is buried with a bit line film and a bit line stacked with a silicon nitride film is formed, a silicon nitride film is deposited and etched back in an anisotropic manner, which forms side walls on side walls of the bit lines.

(ix) Scavenger atoms are implanted into the silicon nitride film along the bit line or into the silicon nitride film forming the side walls under the condition that the implantation dose of the scavenger atoms, which reach materials below the silicon nitride film, must be below the level at which the properties of the materials below the silicon nitride film are deteriorated.

(x) After a silicon oxide film is deposited, a contact hole is formed in a self-aligned manner under the condition that a minute contact hole can be etched with stability using the silicon nitride film, into which the scavenger atoms are implanted, as a stopper.

DETAILED DESCRIPTION OF THE PREFERRED EMBODIMENTS

The embodiments of the present invention will be described hereinafter on the basis of FIGS. 1 through 17.

FIGS. 1 through 6 illustrate a process of a first embodiment, which will be described hereinafter in accordance with FIGS. 1 through 6.

Figure 1:
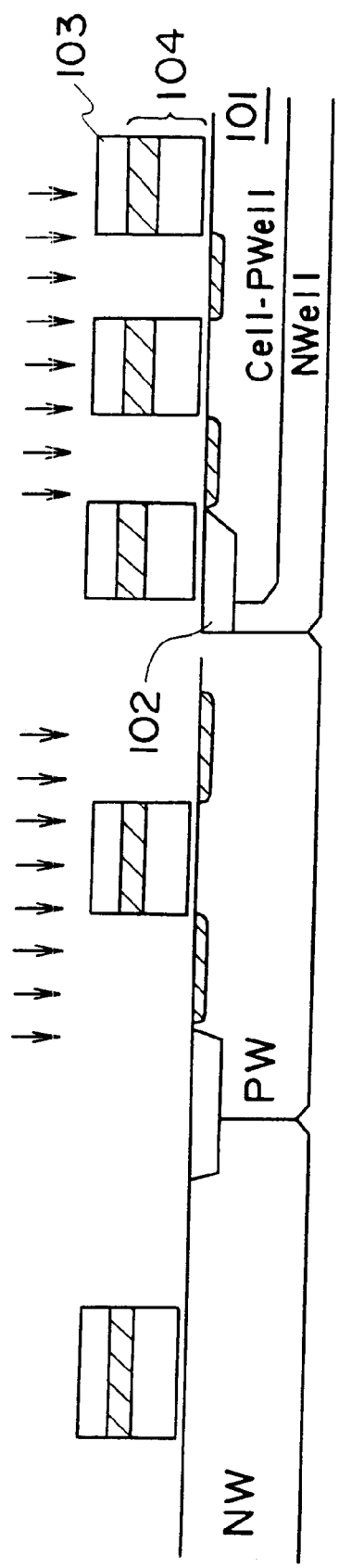
FIG. 1 is an explanatory view of a manufacturing method of a first embodiment of the present invention.

(a) As shown in FIG. 1, after isolation regions 102 are formed on a silicon substrate 101, transfer gates 104 stacked with an offset silicon oxide film 103 are formed by conventional lithography and etching. Subsequently, a mask pattern is formed by conventional lithography, and n-type impurities are implanted into the silicon substrate 101 by ion implantation (referred to as I/I, hereinafter). For simplification, the resist pattern at the time of the I/I is not illustrated.

Figure 2:
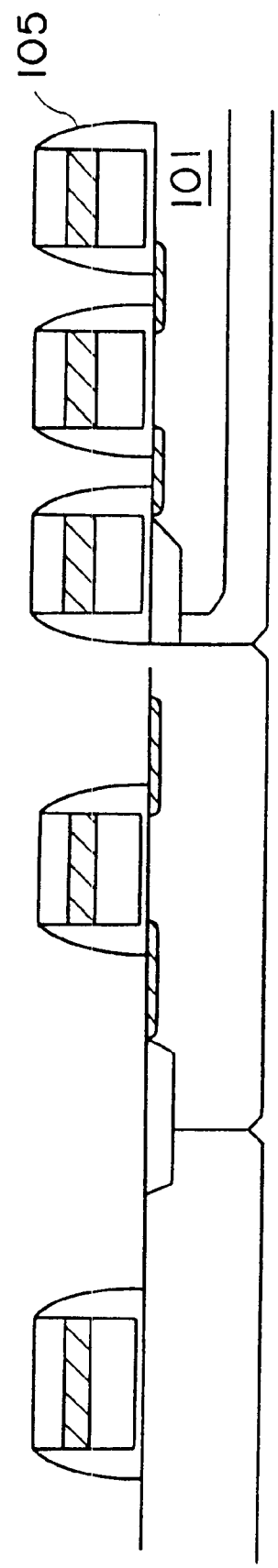
FIG. 2 is an explanatory view of the manufacturing method of the first embodiment of the present invention.

(b) As shown in FIG. 2, a silicon oxide film is deposited on the whole surface of a wafer by chemical vapor deposition (abbreviated to CVD, hereinafter), and is etched in an anisotropic manner to form side walls 105, for example, by utilizing a parallel plate etching system under conditions where the pressure=1 Torr, the reaction gas flow rate $Ar/CHF_3/CF_4$=1000/20/20 cc/min, the RF power=300 W, and the electrode temperature=0° C. The thickness of the side wall 105 is set at a value that allows the transfer gates to operate as desired.

Figure 3:
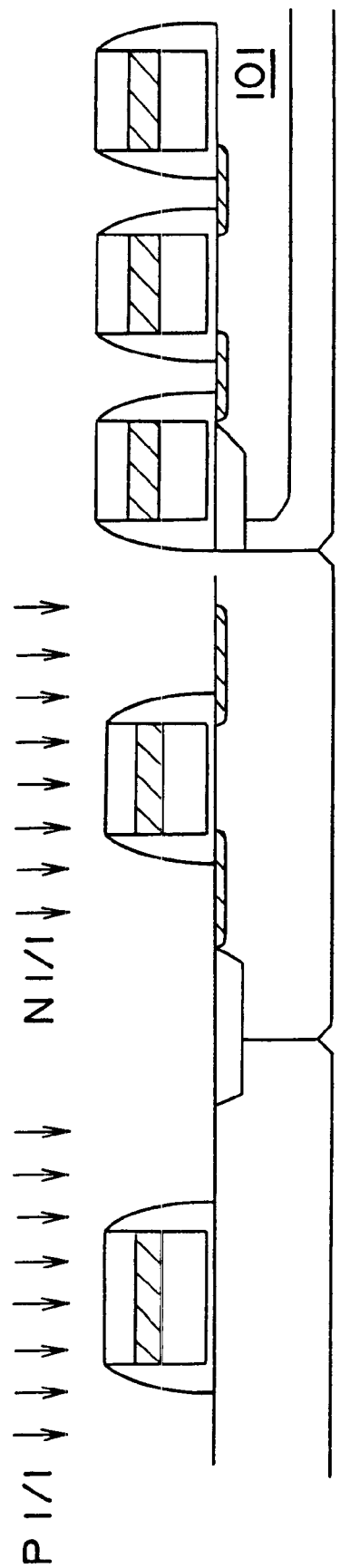
FIG. 3 is an explanatory view of the manufacturing method of the first embodiment of the present invention.

(c) As shown in FIG. 3, mask patterns are formed by conventional lithography, and n-type impurities and p-type impurities are implanted into the silicon substrate 101 by ion implantation. For simplification, the resist patterns at the time of the I/I are not illustrated.

Figure 4:
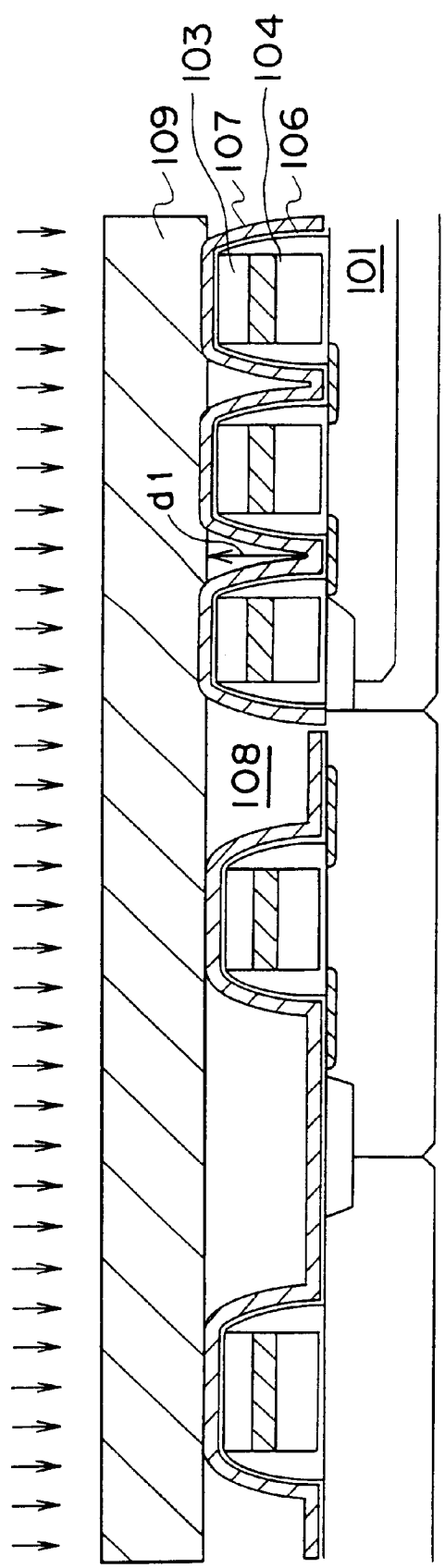
FIG. 4 is an explanatory view of the manufacturing method of the first embodiment of the present invention.

(d) As shown in FIG. 4, after a silicon oxide film 106 is deposited and a silicon nitride film 107 is deposited, a silicon oxide film 108 is deposited. Subsequently, the silicon oxide film 108 is planarized by chemical mechanical polishing (referred to as CMP, hereinafter). Then, the silicon oxide film 108 is etched with diluted hydrogen fluoride aqueous solution until the silicon nitride film 107 is exposed. After an organic film 109 consisting of SWK-EX2 (a trade name, manufactured by TOKYO OHKA KOGYO) is formed by dispensing, boron is implanted by I/I. The thickness of the organic film 109, the offset silicon oxide film 103, and d1 in FIG. 4, and the accelerating energy of boron ions are set, respectively, in such a way that (1) boron is sufficiently implanted into the silicon nitride film on the transfer gates 104 but the implantation dose of boron that goes through the offset silicon oxide film 103 and reaches the transfer gates 104 and a gate insulating film is below the level at which the transistor characteristics are affected, and (2) the implantation dose of boron that reaches the diffusion layer of the transfer gate transistors is below the level at which the transistor characteristics are affected (for example, the thickness of the organic film=0.10 μm, the thickness of the offset silicon oxide film=0.15 μm, the thickness of d1=0.35 μm, and the ion accelerating energy=30 keV).

Figure 5:
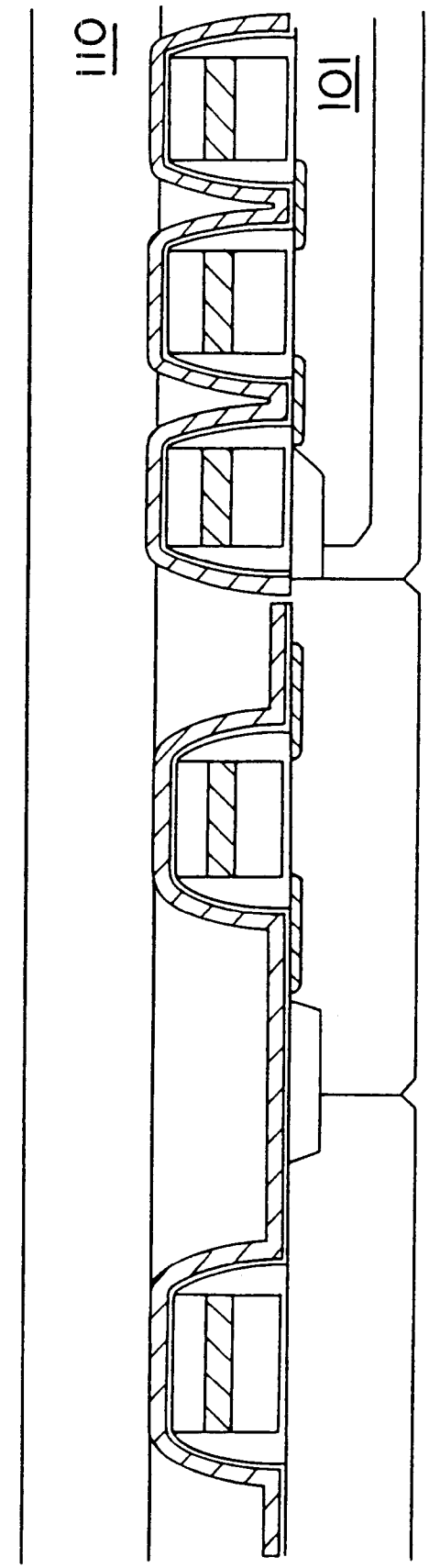
FIG. 5 is an explanatory view of the manufacturing method of the first embodiment of the present invention.

(e) As shown in FIG. 5, after the organic film 109 is incinerated, a silicon oxide film 110 is deposited and planarized by CMP.

Figure 6:
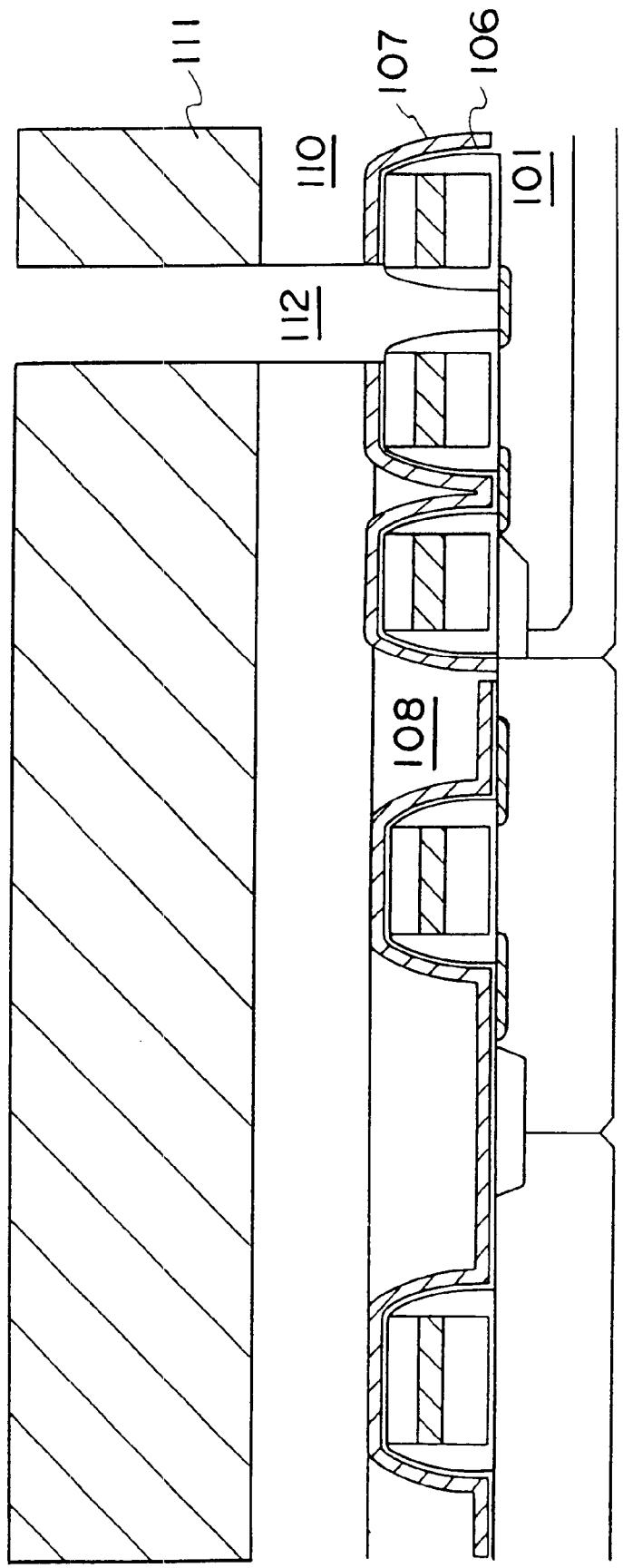
FIG. 6 is an explanatory view of the manufacturing method of the first embodiment of the present invention.

(f) As shown in FIG. 6, a contact hole 112 is opened on the silicon substrate 101 firstly by forming a contact hole pattern 111 for opening the contact hole 112 on the silicon substrate 101 by conventional lithography, and secondly by etching the silicon oxide films 110 and 108 using the silicon nitride film 107 as a stopper, which utilizes, for example, a magnetron etching system under conditions where the pressure=40 mTorr, the reaction gas flow rate $Ar/CO/C_4F_8$= 200/150/9 cc/min, the RF power=1500 W, the chiller He backpressure center/edge=3/70 Torr, the gap between electrodes=27 mm, and the electrode temperature=20° C., which is followed by an etching process of the silicon nitride film 107 and the silicon oxide film 106, utilizing, for example, the same system under the conditions where the pressure=50 mTorr, the reaction gas flow rate $Ar/CHF_3/O_2$= 100/20/20 cc/min, the RF power=400 W, the chiller He backpressure center/edge=3/70 Torr, the gap between electrodes=32 mm, and the electrode temperature=20° C.

Hereafter, a semiconductor device is manufactured, following the conventional manufacturing process of a semiconductor device.

In the present embodiment, when phosphorus is used in place of boron, the thickness of the organic film, the thickness of the offset silicon oxide film, the thickness of d1, and the ion accelerating energy are set, for example, as follows. The thickness of the organic film=0.10 μm, the thickness of the offset silicon oxide film=0.15 μm, the thickness of d1=0.35 μm, and the ion accelerating energy=90 keV.

In the present embodiment, when arsenic is used in place of boron, the thickness of the organic film, the thickness of the offset silicon oxide film, the thickness of d1, and the ion accelerating energy are set, for example, as follows. The thickness of the organic film=0.10 μm, the thickness of the offset silicon oxide film=0.15 μm, the thickness of d1=0.35 μm, and the ion accelerating energy=170 keV.

In the present embodiment, when antimony is used in place of boron, the thickness of the organic film, the thickness of the offset silicon oxide film, the thickness of d1, and the ion accelerating energy are set, for example, as follows. The thickness of the organic film=0.10 μm, the thickness of the offset silicon oxide film=0.15 μm, the thickness of d1=0.35 μm, and the ion accelerating energy=220 keV.

In the present embodiment, when carbon is used in place of boron, the thickness of the organic film, the thickness of the offset silicon oxide film, the thickness of d1, and the ion accelerating energy are set, for example, as follows. The thickness of the organic film=0.15 μm, the thickness of the offset silicon oxide film=0.15 μm, the thickness of d1=0.35 μm, and the ion accelerating energy=40 keV.

In the present embodiment, when boron and carbon are used in place of boron, the thickness of the organic film, the thickness of the offset silicon oxide film, the thickness of d1, and the ion accelerating energy are set, for example, as follows. The thickness of the organic film=0.15 μm, the thickness of the offset silicon oxide film=0.15 μm, the thickness of d1=0.35 μm, and the ion accelerating energy=40 keV.

In the present embodiment, when arsenic and carbon are used in place of boron, the thickness of the organic film, the thickness of the offset silicon oxide film, the thickness of d1, and the ion accelerating energy are set, for example, as follows. The thickness of the organic film=0.10 μm, the thickness of the offset silicon oxide film=0.15 μm, the thickness of d1=0.35 μm, and the ion accelerating energy=30 (carbon), 170 (arsenic) keV.

In the present embodiment, when antimony and carbon are used in place of boron, the thickness of the organic film, the thickness of the offset silicon oxide film, the thickness of d1, and the ion accelerating energy are set, for example, as follows. The thickness of the organic film=0.10 μm, the thickness of the offset silicon oxide film=0.15 μm, the thickness of d1=0.35 μm, and the ion accelerating energy=30 (carbon), 220 (antimony) keV.

In accordance with the first embodiment, in the etching step wherein the contact hole is etched and opened in a self-aligned manner using the silicon nitride film as a stopper, as the scavenger atoms are implanted into the silicon nitride film, high selectivity of silicon oxide for silicon nitride is obtainable even at a high etching rate. Therefore, overetching of the silicon nitride film is prevented under the condition that the silicon oxide film can be etched to the surface of the silicon nitride film deposited on minute spaces between the transfer gates of a memory cell array portion, and under the condition that the silicon oxide film can be etched to the surface of the silicon nitride film deposited as a stopper in a deep metal wiring contact hole.

Further, when the scavenger atoms are implanted into the silicon nitride film, the condition is set that the implantation dose of said atoms, which go beyond the silicon nitride film and reach a portion situated below said silicon nitride film, must be below the level where the characteristics of that portion are affected. In the first embodiment, as the range of ions attained by ion implantation is controlled by the organic film, it is easy to set such a condition.

Next, a second embodiment will be described. A semiconductor device is manufactured in the same process as that of the first embodiment, except that the organic film 108 is not used. The thickness of an offset silicon oxide film 103 and d1 in FIG. 4, and the accelerating energy of boron ions are set, respectively, in such a way that (1) boron is sufficiently implanted into a silicon nitride film on transfer gates 104 but the implantation dose of boron that goes through the offset silicon oxide film 103 and reaches the transfer gates 104 and a gate insulating film is below the level at which the transistor characteristics are affected, and (2) the implantation dose of boron that reaches the diffusion layer of the transfer gate transistor is below the level where the transistor characteristics are affected (for example, the thickness of the offset silicon oxide film=0.15 μm, the thickness of d1=0.35 μm, and the ion accelerating energy=15 keV).

In the present embodiment, when phosphorus is used in place of boron, the thickness of the offset silicon oxide film, the thickness of d1, and the ion accelerating energy are set, for example, as follows. The thickness of the offset silicon oxide film=0.15 μm, the thickness of d1=0.35 μm, and the ion accelerating energy=40 keV.

In the present embodiment, when arsenic is used in place of boron, the thickness of the offset silicon oxide film, the thickness of d1, and the ion accelerating energy are set, for example, as follows. The thickness of the offset silicon oxide film=0.15 μm, the thickness of d1=0.35 μm, and the ion accelerating energy=70 keV.

In the present embodiment, when antimony is used in place of boron, the thickness of the offset silicon oxide film, the thickness of d1, and the ion accelerating energy are set, for example, as follows. The thickness of the offset silicon oxide film=0.15 μm, the thickness of d1=0.35 μm, and the ion accelerating energy=100 keV.

In the present embodiment, when carbon is used in place of boron, the thickness of the offset silicon oxide film, the thickness of d1, and the ion accelerating energy are set, for example, as follows. The thickness of the offset silicon oxide film=0.15 μm, the thickness of d1=0.35 μm, and the ion accelerating energy=20 keV.

In the present embodiment, when boron and carbon are used in place of boron, the thickness of the offset silicon oxide film, the thickness of d1, and the ion accelerating energy are set, for example, as follows. The thickness of the offset silicon oxide film=0.15 μm, the thickness of d1=0.35 μm, and the ion accelerating energy=15 (boron), 20 (carbon) keV.

In the present embodiment, when arsenic and carbon are used in place of boron, the thickness of the offset silicon oxide film, the thickness of d1, and the ion accelerating energy are set, for example, as follows. The thickness of the offset silicon oxide film=0.15 μm, the thickness of d1=0.35 μm, and the ion accelerating energy=70 (arsenic), 20 (carbon) keV.

In the present embodiment, when antimony and carbon are used in place of boron, the thickness of the offset silicon oxide film, the thickness of d1, and the ion accelerating energy are set, for example, as follows. The thickness of the offset silicon oxide film=0.15 μm, the thickness of d1=0.35 μm, and the ion accelerating energy=100 (antimony), 20 (carbon) keV.

In accordance with the second embodiment, as is the case with the first embodiment, in the etching step wherein the contact hole is etched and opened in a self-aligned manner using the silicon nitride film as a stopper, as the scavenger atoms are implanted into the silicon nitride film, high selectivity of silicon oxide for silicon nitride is obtainable even at a high etching rate. Therefore, overetching of the silicon nitride film is prevented under the condition that the silicon oxide film can be etched to the surface of the silicon nitride film deposited on minute spaces between the transfer gates of a memory cell array portion and under the condition that the silicon oxide film can be etched to the surface of the silicon nitride film deposited as a stopper in a deep metal contact hole.

Further, when the scavenger atoms are implanted into the silicon nitride film, the condition is set that the implantation dose of said atoms, which go beyond the silicon nitride film and reach a portion situated below said silicon nitride film, must be below the level where the characteristics of that portion are affected. However, it is possible to set such a condition without using the organic film.

Further, in the present embodiment, the scavenger atoms can be implanted into the silicon nitride film by low energy I/I with ion accelerating energy of not higher than approximately 10 keV. In such low energy I/I, as the ion accelerating energy is lower compared with the normal energy I/I, the mean value and the standard deviation of the projected range of the atoms are decreased. For example, in the case of boron, when the accelerating energy is 10 keV, those of the silicon nitride film are 21.9 nm and 12.0 nm, respectively, and those of the silicon oxide film are 28.3 nm and 15.5 nm, respectively. Therefore, when the silicon nitride film (generally 50 nm thick) is provided as a stopper, the implantation dose of boron that reaches the diffusion layer of the transfer gate transistors is below the level at which the transistor characteristics are affected. Additionally, the implantation dose of boron that goes through the offset silicon oxide film (generally 150 nm thick) and reaches the transfer gates and the gate insulating film is below the level at which the transistor characteristics are affected.

The thickness of the offset silicon oxide film and the thickness of the silicon oxide film on the diffusion layer of the transfer gate transistors are determined primarily on the basis of workability, and the ion accelerating energy is determined in such a way that lowering of throughput is minimized.

Next, a third embodiment will be described. A semiconductor device is manufactured in a similar manner to the second embodiment, except that boron is implanted into a silicon nitride film by an ionization sputtering method, using a target made of boron nitride.

In the ionization sputtering method, it is possible to accelerate sputtering particles, which are ionized by plasma, by AC bias applied to a wafer installing electrode. When the AC bias is set in such a way that the maximum value of this accelerating energy is not higher than several keV (for example, the thickness of the offset silicon oxide film=0.15 μm, the thickness of d1=0.35 μm, and the maximum value of the ion accelerating energy=3 keV), not only can boron be implanted into the silicon nitride film, but the implantation dose of boron that reaches the transfer gates, the diffusion layer of the transfer gate transistors, and the gate insulating film is restricted to be below the level at which the transfer gate characteristics are affected, as is the case with the second embodiment, without dispensing the organic film.

As a target, carbon as well as boron nitride are easily obtainable.

In the present embodiment, when a target made of carbon is used and carbon is implanted in place of boron, the thickness of the offset silicon oxide film, the thickness of d1, and the ion accelerating energy are set, for example, as follows. The thickness of the offset silicon oxide film=0.15 μm, the thickness of d1=0.35 μm, and the maximum value of the ion accelerating energy=3 keV.

In the present embodiment, when a target made of boron nitride and a target made of carbon are used and boron and carbon are implanted, the thickness of the offset silicon oxide film, the thickness of d1, and the ion accelerating energy are set, for example, as follows. The thickness of the offset silicon oxide film=0.15 μm, the thickness of d1=0.35 μm, and the maximum value of the ion accelerating energy=3 keV.

In accordance with the third embodiment, as is the case with the first embodiment, in the etching step wherein the contact hole is etched and opened in a self-aligned manner using the silicon nitride film as a stopper, as the scavenger atoms are implanted into the silicon nitride film, high selectivity of silicon oxide for silicon nitride is obtainable at a high etching rate. Therefore, overetching of the silicon nitride film is prevented under the condition that the silicon oxide film can be etched to the surface of the silicon nitride film deposited on minute spaces between the transfer gates of a memory cell array portion and under the condition that the silicon oxide film can be etched to the surface of the silicon nitride film deposited as a stopper in a deep metal contact hole.

Further, when the scavenger atoms are implanted into the silicon nitride film, the condition is set that the implantation dose of said atoms, which go beyond the silicon nitride film and reach a portion situated below said silicon nitride film, must be below the level at which the characteristics of that portion are affected. However, as the ion accelerating energy in the ionization sputtering method can be set relatively low, such a condition can be easily set without using the organic film. For example, when the maximum value of the ion accelerating energy is set not higher than 1 keV and the ion projected range is not longer than several nm, not only can boron be implanted into the silicon nitride film, but the implantation dose of boron that reaches the transfer gates, the diffusion layer of the transfer gate transistors, and the gate insulating film is restricted to be below the level at which the transfer gate characteristics are affected, without inclining the wafer.

Next, a fourth embodiment will be described. A semiconductor device is manufactured in a similar manner to the first embodiment, except that the wafer is inclined when boron is implanted into the silicon nitride film.

The fourth embodiment will be descried hereinafter with reference to FIG. 7.

The steps (a) through (c) and (e) through (f) in the fourth embodiment are the same as those of the first embodiment. The step (d) in the first embodiment is conducted as follows.

Figure 7:
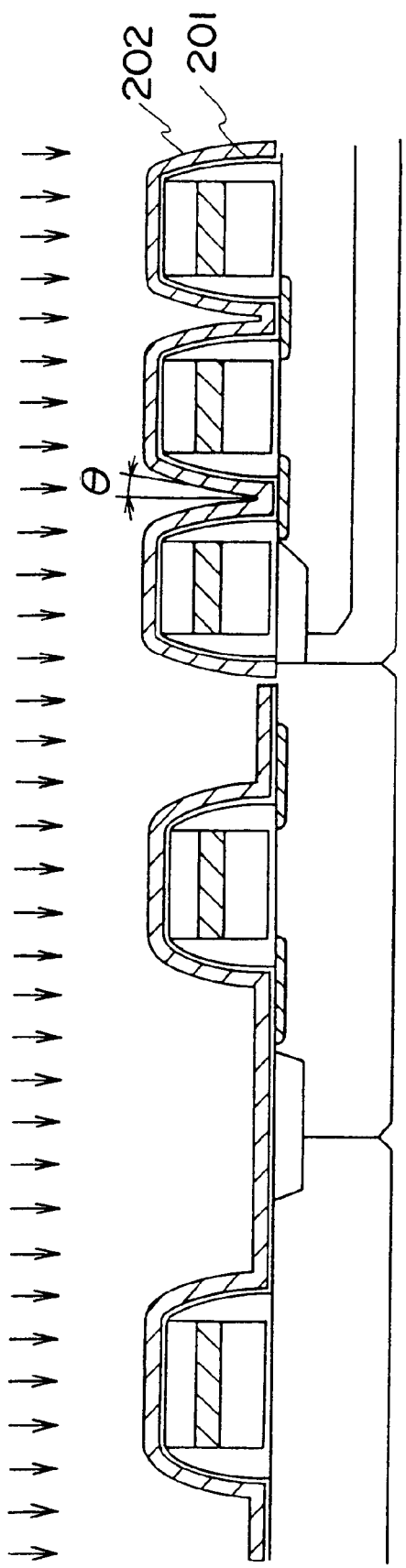
FIG. 7 is an explanatory view of a manufacturing method of a fourth embodiment of the present invention.

(d) As shown in FIG. 7, after a silicon oxide film 201 and a silicon nitride film 202 are sequentially deposited, boron is implanted into the silicon nitride film by low energy I/I, with a wafer being inclined at a wider angle than the apparent angle (θ in FIG. 7) of the incident ions viewed from the silicon nitride film 202. The conditions are set, for example, as follows. The thickness of the offset silicon oxide film= 0.15 μm, the thickness of d1=0.35 μm, the ion accelerating energy=15 keV, and the wafer inclination=30 degrees.

In the present embodiment, when phosphorus is used in place of boron, the thickness of the offset silicon oxide film, the thickness of d1, the ion accelerating energy, and the wafer inclination are set, for example, as follows. The thickness of the offset silicon oxide film=0.15 μm, the thickness of d1=0.35 μm, the ion accelerating energy=40 keV, and the wafer inclination=30 degrees.

In the present embodiment, when arsenic is used in place of boron, the thickness of the offset silicon oxide film, the thickness of d1, the ion accelerating energy, and the wafer inclination are set, for example, as follows. The thickness of the offset silicon oxide film=0.15 μm, the thickness of d1=0.35 μm, the ion accelerating energy=70 keV, and the wafer inclination=30 degrees.

In the present embodiment, when antimony is used in place of boron, the thickness of the offset silicon oxide film, the thickness of d1, the ion accelerating energy and the wafer inclination are set, for example, as follows. The thickness of the offset silicon oxide film=0.15 μm, the thickness of d1=0.35 μm, the ion accelerating energy=100 keV, and the wafer inclination=30 degrees.

In the present embodiment, when carbon is used in place of boron, the thickness of the offset silicon oxide film, the thickness of d1, the ion accelerating energy and the wafer inclination are set, for example, as follows. The thickness of the offset silicon oxide film=0.15 μm, the thickness of d1=0.35 μm, the ion accelerating energy=20 keV, and the wafer inclination=30 degrees.

In the present embodiment, when boron and carbon are used in place of boron, the thickness of the offset silicon oxide film, the thickness of d1, the ion accelerating energy, and the wafer inclination are set, for example, as follows. The thickness of the offset silicon oxide film=0.15 μm, the thickness of d1=0.35 μm, the ion accelerating energy=15 (boron), 20 (carbon) keV, and the wafer inclination=30 degrees.

In the present embodiment, when arsenic and carbon are used in place of boron, the thickness of the offset silicon oxide film, the thickness of d1, the ion accelerating energy, and the wafer inclination are set, for example, as follows. The thickness of the offset silicon oxide film=0.15 μm, the thickness of d1=0.35 μm, the ion accelerating energy=70 (arsenic), 20 (carbon) keV, and the wafer inclination=30 degrees.

In the present embodiment, when antimony and carbon are used in place of boron, the thickness of the offset silicon oxide film, the thickness of d1, the ion accelerating energy, and the wafer inclination are set, for example, as follows. The thickness of the offset silicon oxide film=0.15 μm, the thickness of d1=0.35 μm, and the ion accelerating energy= 100 (antimony), 20 (carbon) keV, and the wafer inclination= 30 degrees.

In accordance with the fourth embodiment, as is the case with the first embodiment, in the etching step wherein the contact hole is etched and opened in a self-aligned manner using the silicon nitride film as a stopper, as the scavenger atoms are implanted into the silicon nitride film, high selectivity of silicon oxide for silicon nitride is obtainable at a high etching rate. Therefore, overetching of the silicon nitride film is prevented under the condition that the silicon oxide film can be etched to the surface of the silicon nitride film deposited on minute spaces between the transfer gates of a memory cell array portion and under the condition that the silicon oxide film can be etched to the surface of the silicon nitride film deposited as a stopper in a deep metal contact hole.

Further, when the scavenger atoms are implanted into the silicon nitride film, the condition is set that the implantation dose of said atoms, which go beyond the silicon nitride film and reach a portion situated below said silicon nitride film, must be below the level at which the characteristics of that portion are affected. However, as not only is low energy I/I being used but also the scavenger atoms implanted with a wafer are being inclined at a wider angle than the apparent angle (θ in FIG. 7) of the incident ions viewed from the silicon nitride film, such a condition can be easily set without depositing the silicon oxide film on the silicon nitride film for planarization and etching the silicon oxide film until the silicon nitride film is exposed.

Further, in the present embodiment, when the ionization sputtering method is used as the ion implantation method, the ion accelerating energy in the ionization sputtering method can be set relatively low, thereby further facilitating the setting of such a condition.

Next, a fifth embodiment will be described. A semiconductor device is manufactured in a similar manner to the first embodiment, except that the process to form the silicon nitride film, into which the scavenger atoms are implanted, is changed.

The fifth embodiment will be described hereinafter with reference to FIGS. 8 through 11.

The steps (a), (d), and (e) in the fifth embodiment are the same as those of the first embodiment. The steps (b) and (c) in the first embodiment are conducted as follows.

Figure 8:
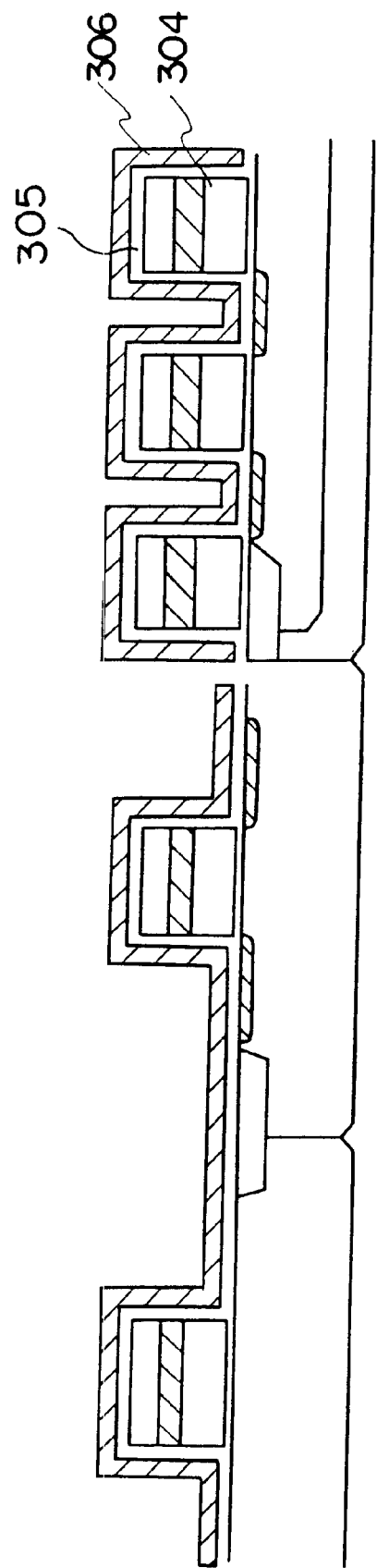
FIG. 8 is an explanatory view of a manufacturing method of a fifth embodiment of the present invention.
Figure 9:
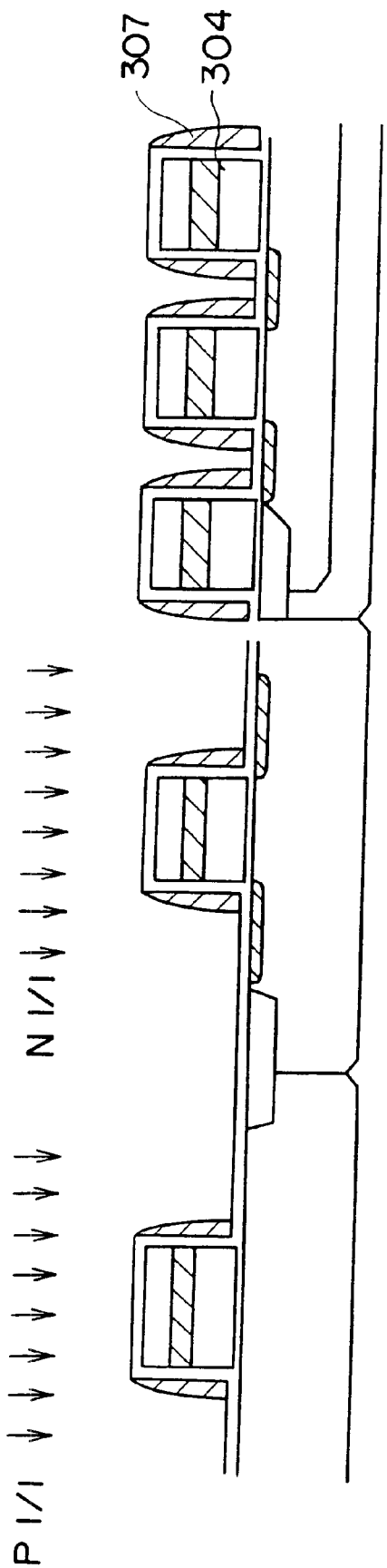
FIG. 9 is an explanatory view of the manufacturing method of the fifth embodiment of the present invention.

(b) As shown in FIGS. 8 and 9, a silicon oxide film 305 and a polycrystalline silicon film 306 are sequentially deposited. Subsequently, side walls 307 are formed by etching the polycrystalline silicon film 306 in an anisotropic manner, which utilizes, for example, an ECR (electron cyclotron resonance) plasma etching system with 2.45 GHz of discharge frequency under conditions where the pressure=5 mTorr, the reaction gas flow rate $Cl_2$=100 cc/min, the microwave power=300 W, RF bias power=20 W, and the electrode temperature=20° C. At this time, the thickness of the polycrystalline silicon film is set in such a way that the total thickness of the silicon oxide film 305 and the side wall 307 amounts to the desired thickness of the side wall. Subsequently, mask patterns are formed by conventional lithography, and n-type impurities and p-type impurities are implanted into the silicon substrate by I/I, respectively. For simplification, the resist patterns at the time of the I/I are not illustrated.

Figure 10:
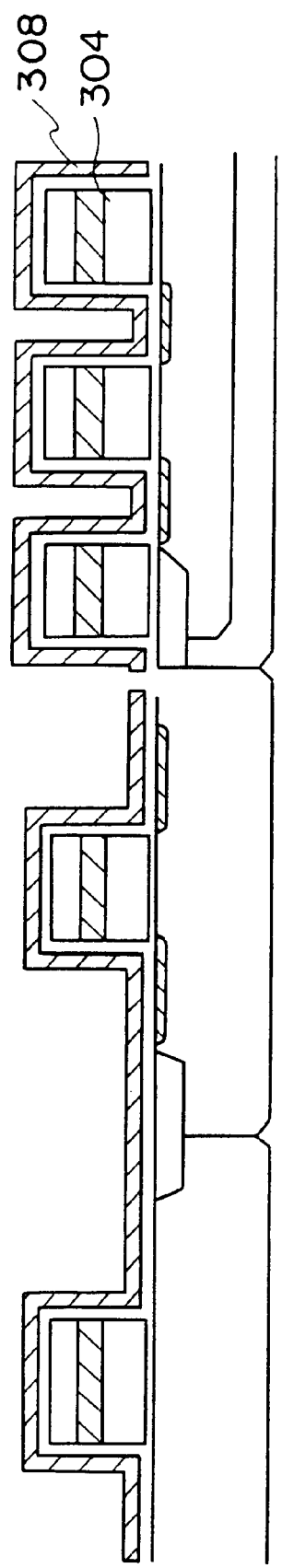
FIG. 10 is an explanatory view of the manufacturing method of the fifth embodiment of the present invention.

As shown in FIG. 9 and 10, the polycrystalline silicon film of the side walls 307 is etched in an isotropic manner after sufficient selectivity of polycrystalline silicon for silicon oxide is ensured, for example, by utilizing a microwave downflow etching system with 2.45 GHz of discharge frequency under conditions where the pressure=40 Pa, the reaction gas flow rate $CF_4/O_2/Cl_2$=175/125/40 cc/min, the microwave power=500 W, and the electrode temperature= 20° C. Subsequently, a thick silicon nitride film 308 that does not seal between transfer gates 305 in a memory cell array portion and functions as a stopper is deposited.

Figure 11:
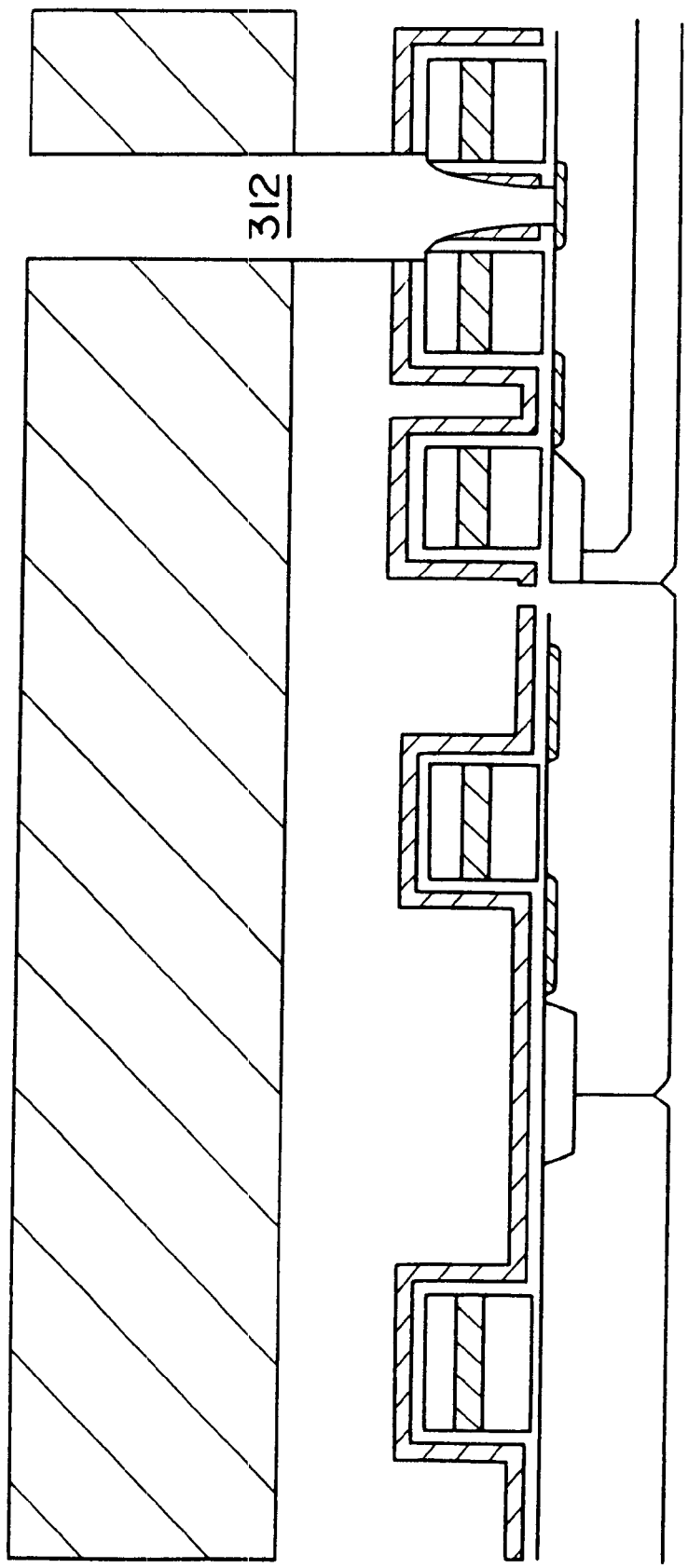
FIG. 11 is an explanatory view of the manufacturing method of the fifth embodiment of the present invention.

In this manner, a contact hole 312 shown in FIG. 11 is formed.

In this embodiment, a silicon nitride film can be used as a film to form side walls. An example of this case is shown as follows. In order to form side walls by etching a silicon nitride film in an anisotropic manner using a silicon oxide film as a stopper, main etching is conducted, for example, by utilizing a parallel plate reactive etching system with 13.56 MHz of discharge frequency under conditions where the pressure=40 mTorr, the reaction gas flow rate $CHF_3/O_2$=67/13 cc/min, the RF power applied to the lower electrode=350 W, the gap between electrodes =35 mm, and the electrode temperature=20° C. The processing is then conducted under conditions where the pressure=325 mTorr, the reaction gas flow rate $CHF_3/SF_6$=10/100 cc/min, the RF power applied to the upper electrode=140 W, the gap between electrodes=20 mm, and the electrode temperature=40° C.

Next, in order to etch the side walls in an isotropic manner using the silicon oxide film as a stopper, the processing is conducted, for example, by utilizing a microwave downflow etching system with 2.45 GHz of discharge frequency under conditions where the pressure=80 Pa, the reaction gas flow rate $CF_4/O_2/N_2/Cl_2$=270/270/80/170 cc/min, the microwave power=600 W, and the electrode temperature=25° C.

The manufacturing methods of the present invention are also applicable to the process wherein the configurations between transfer gates differ, as shown in the present embodiment, such as the process wherein a silicon oxide film is firstly deposited after transfer gates are formed, side walls are secondly formed with a polycrystalline silicon film or a silicon nitride film using the silicon oxide film as a stopper, the side walls are thirdly removed after impurities are implanted into a silicon substrate, and the silicon nitride film is finally deposited, which is then etched to open an contact hole in a self-aligned manner using the silicon nitride film as a stopper.

Next, a sixth embodiment will be described. The present embodiment relates to a process wherein in a DRAM chip or the like, a contact hole is opened in a self-aligned manner by using a silicon nitride film along a bit line and a silicon nitride film, which exists like side walls on the side walls of the bit line, in relation to a silicon substrate existing below the bit line or to a pad electrically connected to the silicon substrate. The present embodiment describes the case where, in accordance with the first embodiment, after boron is implanted into a silicon nitride film on transfer gates, a contact hole is formed on a silicon substrate using the silicon nitride film as a stopper, and then a pad and a bit line for connecting a capacitor electrode with the silicon substrate are sequentially formed, after which boron is implanted by an ion implantation method on a silicon nitride film along the bit line and a silicon nitride film which exists like side walls on the side walls of the bit line.

The sixth embodiment will be descried hereinafter with reference to FIGS. 12 through 17.

Figure 12:
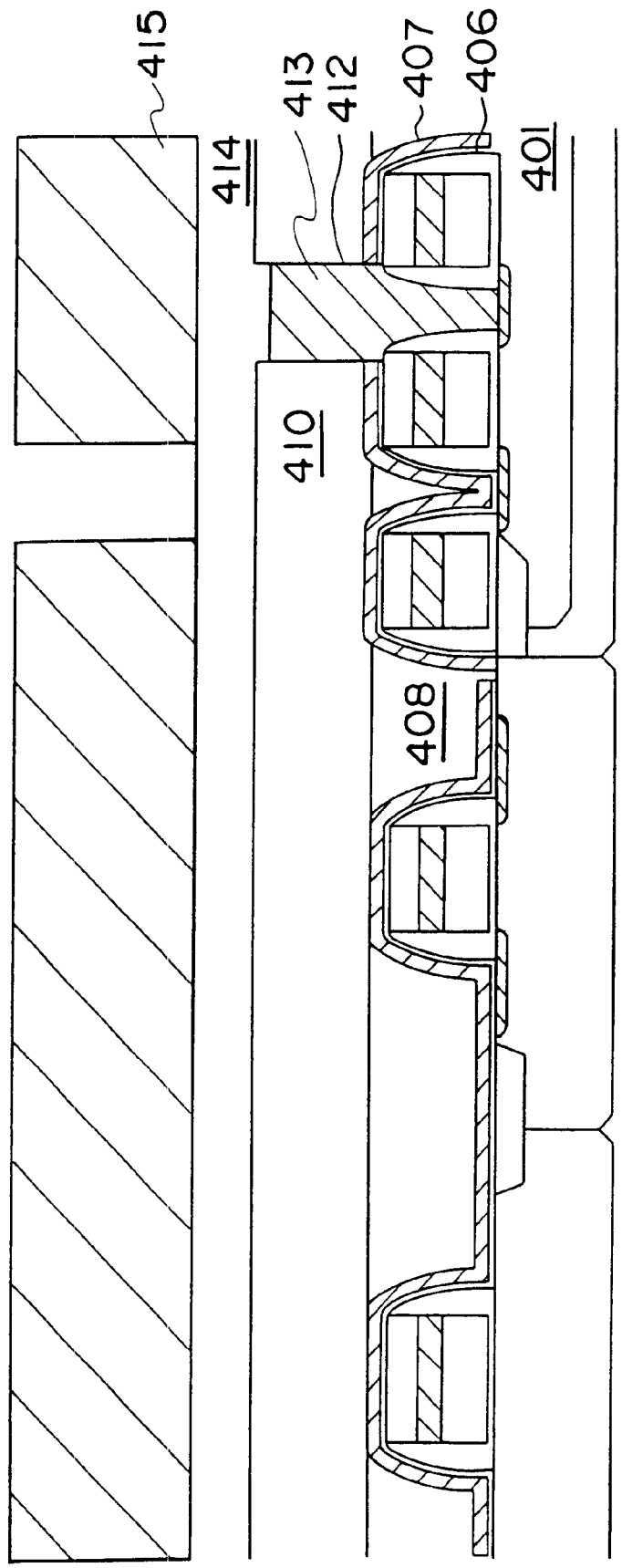
FIG. 12 is an explanatory view of a manufacturing method of a sixth embodiment of the present invention.

(g) As shown in FIG. 12, in a similar manner to the steps (a) through (f) in the first embodiment, a pad 413 is formed by forming a contact hole 412, which is then buried by a polycrystalline silicon film and etched back. Subsequently, after a silicon oxide film 414 is deposited, a contact hole pattern 415 for connecting a bit line with a silicon substrate is formed by conventional lithography.

Figure 13:
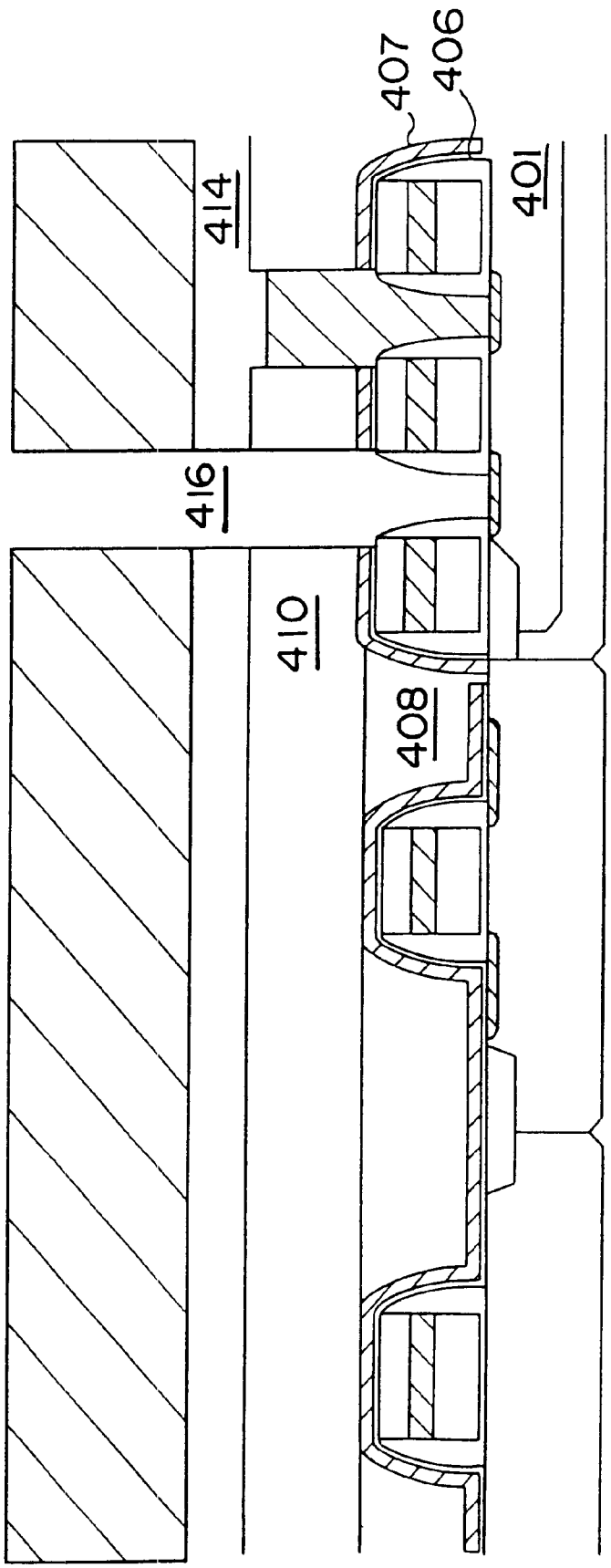
FIG. 13 is an explanatory view of the manufacturing method of the sixth embodiment of the present invention.

As shown in FIG. 13, a contact hole 416 is opened on a silicon substrate 401 firstly by etching silicon oxide films 414, 410, and 408 using a silicon nitride film 407 as a stopper, which utilizes, for example, a magnetron etching system under conditions where the pressure=40 mTorr, the reaction gas flow rate $Ar/CO/C_4F_8$=200/150/9 cc/min, the RF power=1500 W, the chiller He backpressure center/edge=3/70 Torr, the gap between electrodes=27 mm, and the electrode temperature=20° C., which is followed by an etching process of the silicon nitride film 407 and a silicon oxide film 406, utilizing, for example, the same system under conditions where the pressure=40 mTorr, the reaction gas flow rate $Ar/CHF_3/O_2$=100/20/20 cc/min, the RF power=400 W, the chiller He backpressure center/edge=3/70 Torr, the gap between electrodes=32 mm, and the electrode temperature=20° C.

Figure 14:
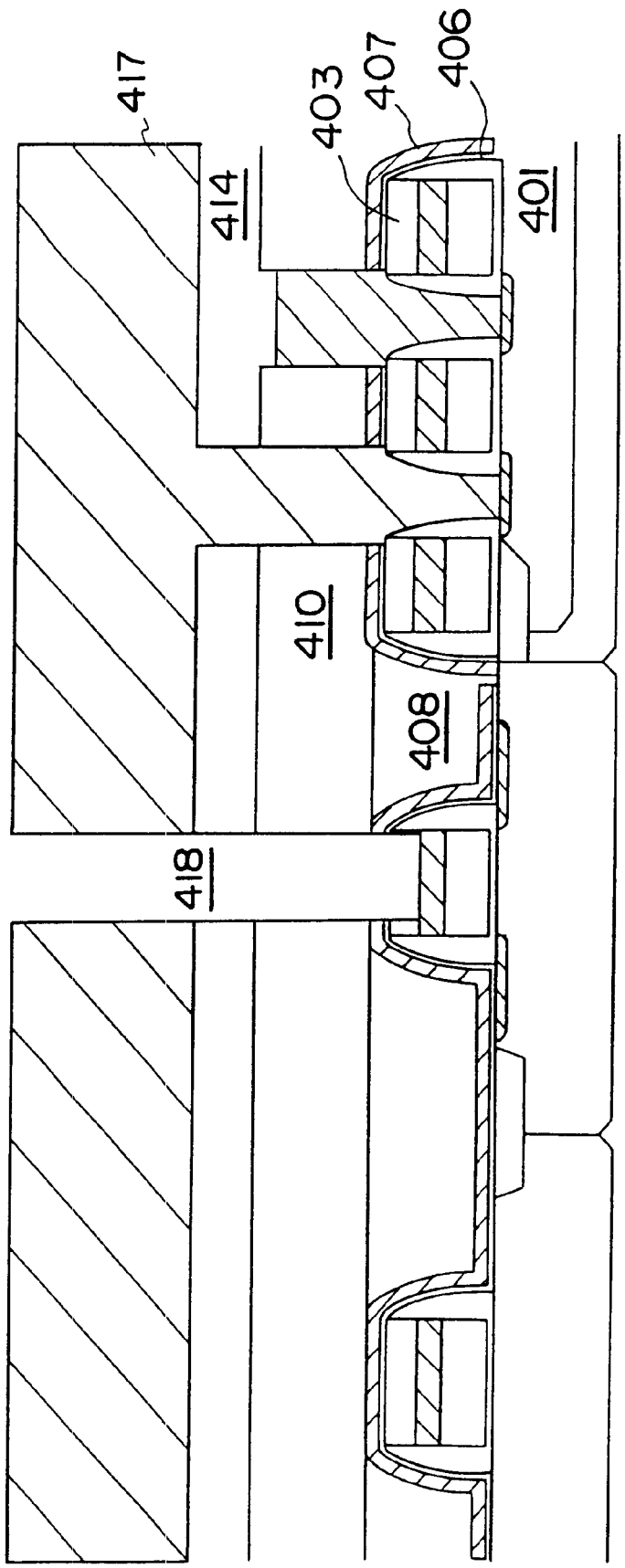
FIG. 14 is an explanatory view of the manufacturing method of the sixth embodiment of the present invention.

(i) As shown in FIG. 14, a contact hole 418 is opened on transfer gates 404 firstly by forming a contact hole pattern 417 for opening a contact hole 418 on transfer gates by conventional lithography after the contact hole pattern (resist) 415 is incinerated, secondly by etching silicon oxide films 414 and 410 using the silicon nitride film 407 as a stopper, which utilizes, for example, the magnetron etching system under the condition that the pressure=40 mTorr, the reaction gas flow rate $Ar/CO/C_4F_8$=200/150/9 cc/min, the RF power=1500 W, the chiller He backpressure center/edge=3/70 Torr, the gap between electrodes=27 mm, and the electrode temperature=20° C., and thirdly by etching the silicon nitride film 407, which utilizes, for example, the same system under conditions where the pressure=40 mTorr, the reaction gas flow rate $Ar/CHF_3/O_2$=100/20/20 cc/min, the RF power=400 W, the chiller He backpressure center/edge=3/70 Torr, the gap between electrodes=32 mm, and the electrode temperature=20° C., which is followed by an etching process of the silicon oxide film 406 and an offset silicon oxide film 403, utilizing, for example, the same system under conditions where the pressure=30 mTorr, the reaction gas flow rate $Ar/C_4F_8/CO/O_2$=300/14/50/7 cc/min, the RF power=1500 W, the chiller He backpressure center/edge=3/70 Torr, the gap between electrodes=27 mm, and the electrode temperature=20° C. Hereinafter, the contact hole is referred to as the bit line contact hole.

Figure 15:
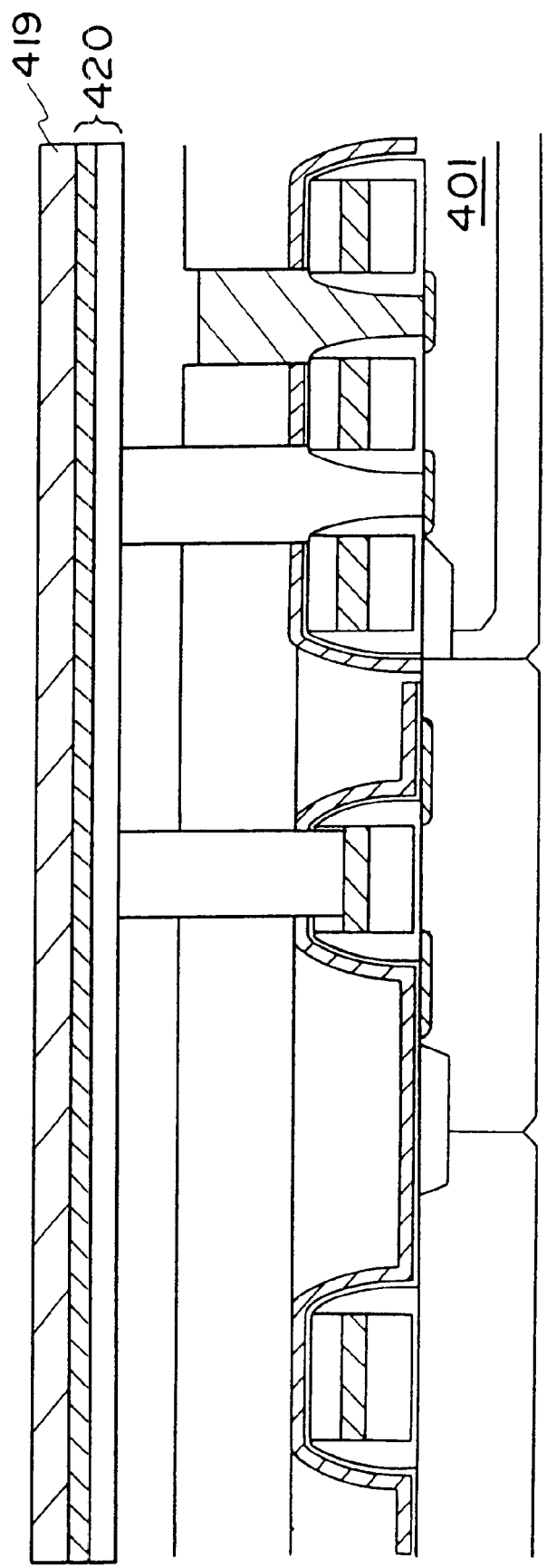
FIG. 15 is an explanatory view of the manufacturing method of the sixth embodiment of the present invention.

(b) As shown in FIG. 15, a bit line pattern (not shown) is formed by conventional lithography, firstly by incinerating the contact hole pattern (resist) 417, secondly by depositing a bit line film so that the bit line contact hole 418 is buried, and thirdly by depositing a silicon nitride film 419. Subsequently, the resist for the bit line pattern is incinerated after etching the silicon nitride film 419, for example, by utilizing a parallel plate etching system under conditions where the pressure=1500 mtorr, the reaction gas flow rate Ar/$CHF_3$/$CF_4$=1000/30/35 cc/min, the RF power=800 W, and the electrode temperature=0° C. Subsequently, by using, for example, an ECR etching system, a bit line 420 is formed, by a first step where it is etched under the conditions where th e pressure=5 mTorr, the reaction gas flow rate $Cl_2$/$O_2$=90/10 cc/min, the microwave power=400 W, RF bias power=60 W, and the electrode temperature=20° C., and then by a second step where it is etched under conditions where the pressure=5 mTorr, the reaction gas flow rate $Cl_2$/$O_2$=90/10 cc/min, the microwave power=400 W, RF bias power=30 W, and the electrode temperature=20° C.

Figure 16:
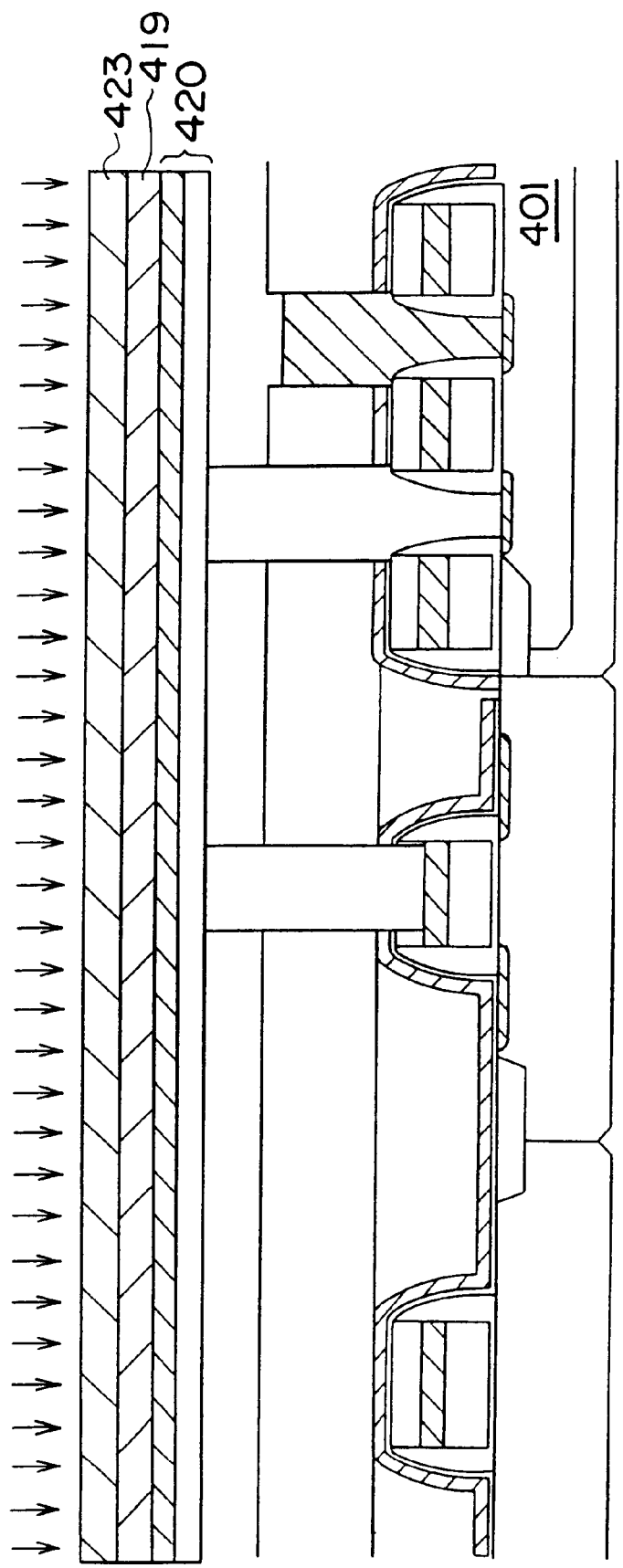
FIG. 16 is an explanatory view of the manufacturing method of the sixth embodiment of the present invention.
Figure 17:
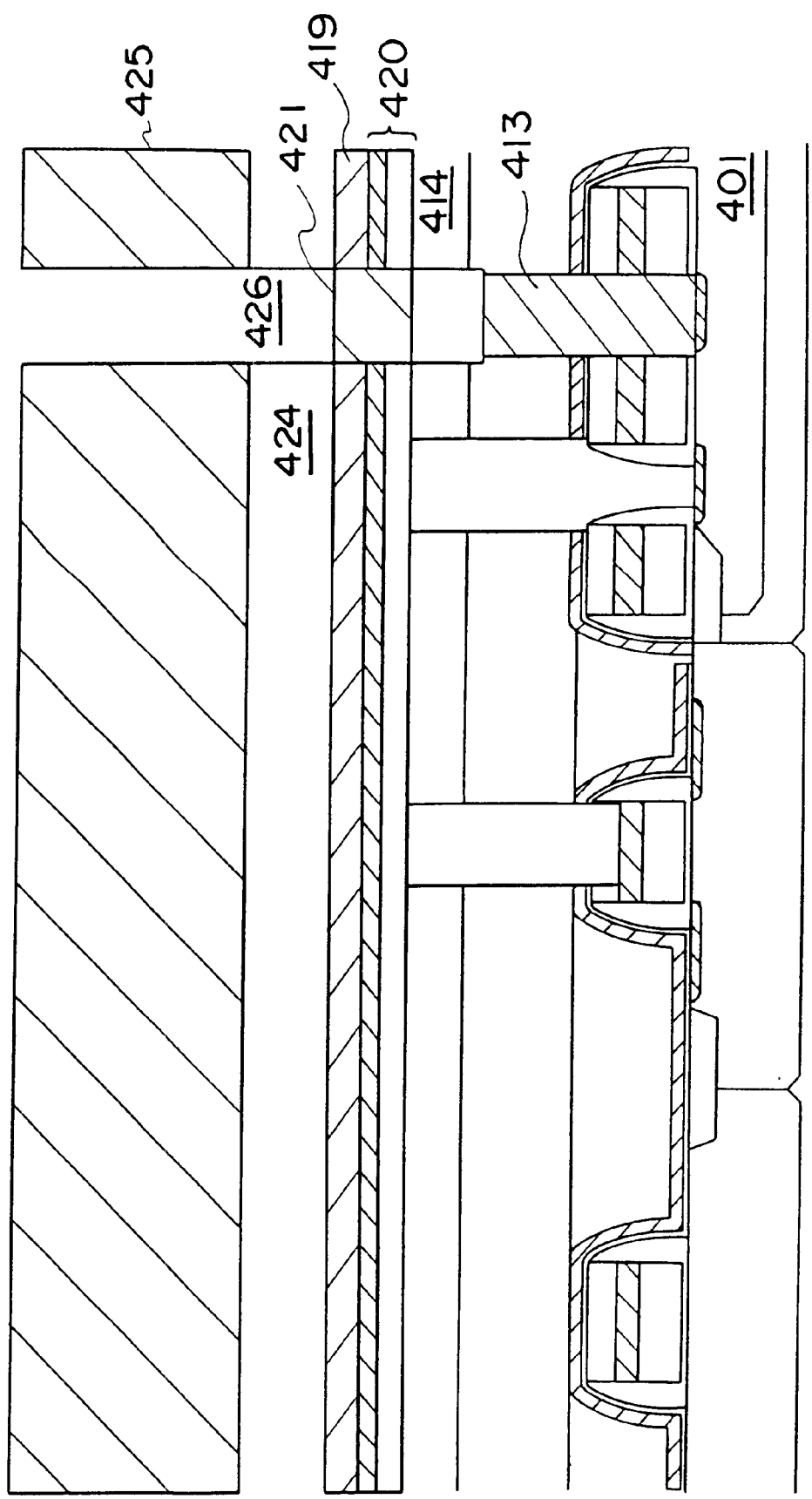
FIG. 17 is an explanatory view of the manufacturing method of the sixth embodiment of the present invention.
Figure 18:
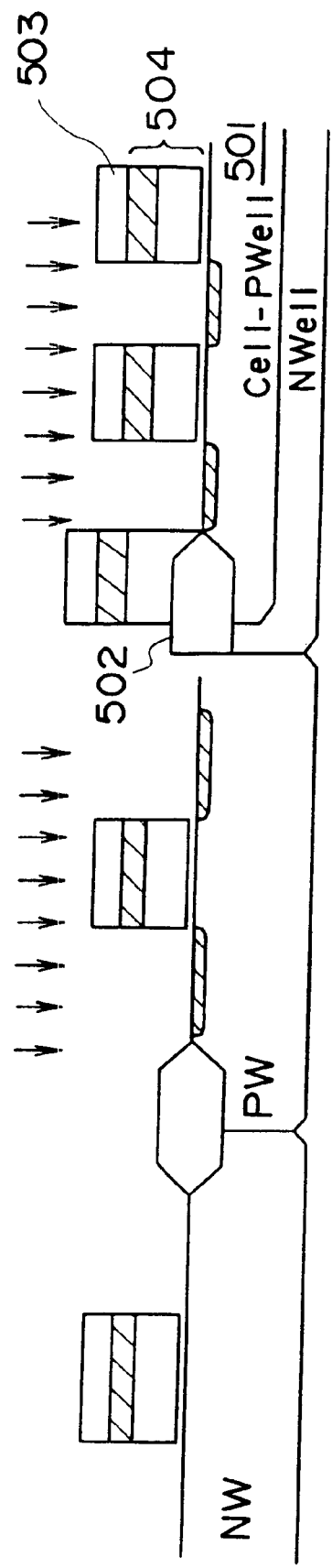
FIG. 18 is an explanatory view of a manufacturing method available in the prior art.
Figure 19:
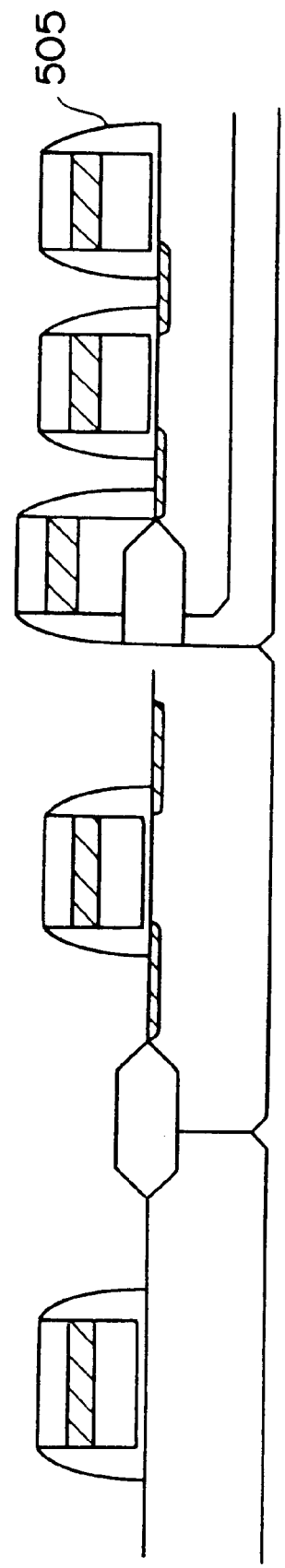
FIG. 19 is an explanatory view of the manufacturing method available in the prior art.
Figure 20:
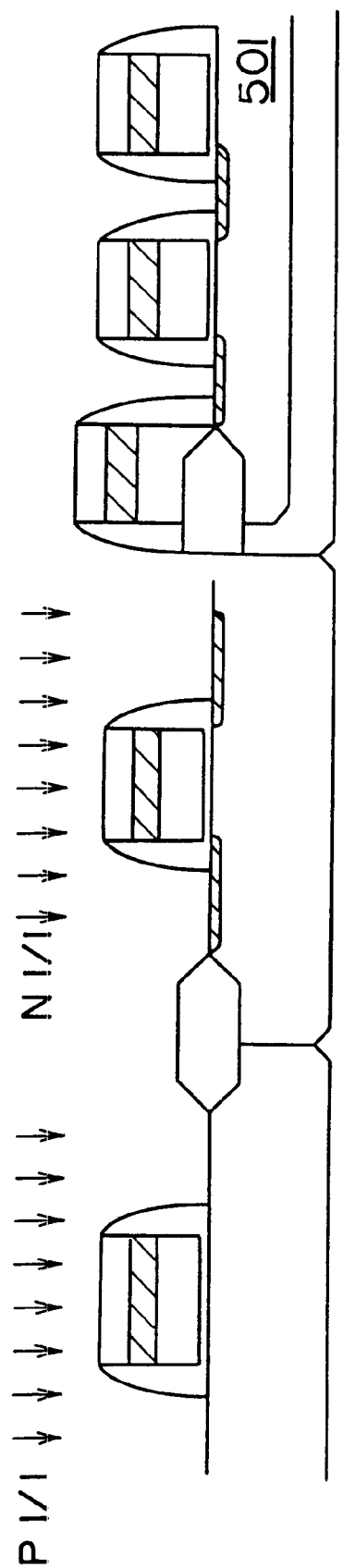
FIG. 20 is an explanatory view of the manufacturing method available in the prior art.
Figure 21:
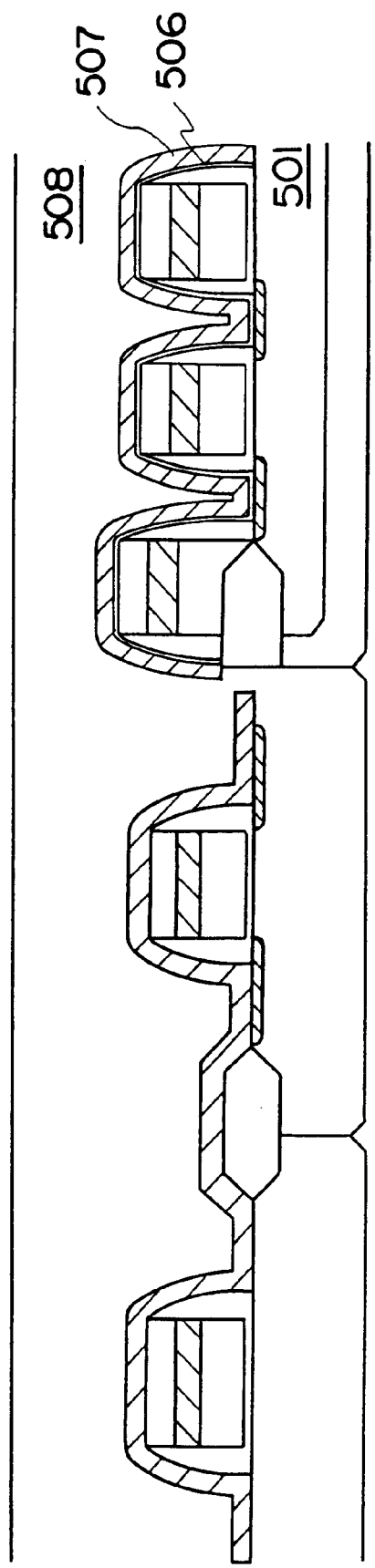
FIG. 21 is an explanatory view of the manufacturing method available in the prior art.
Figure 22:
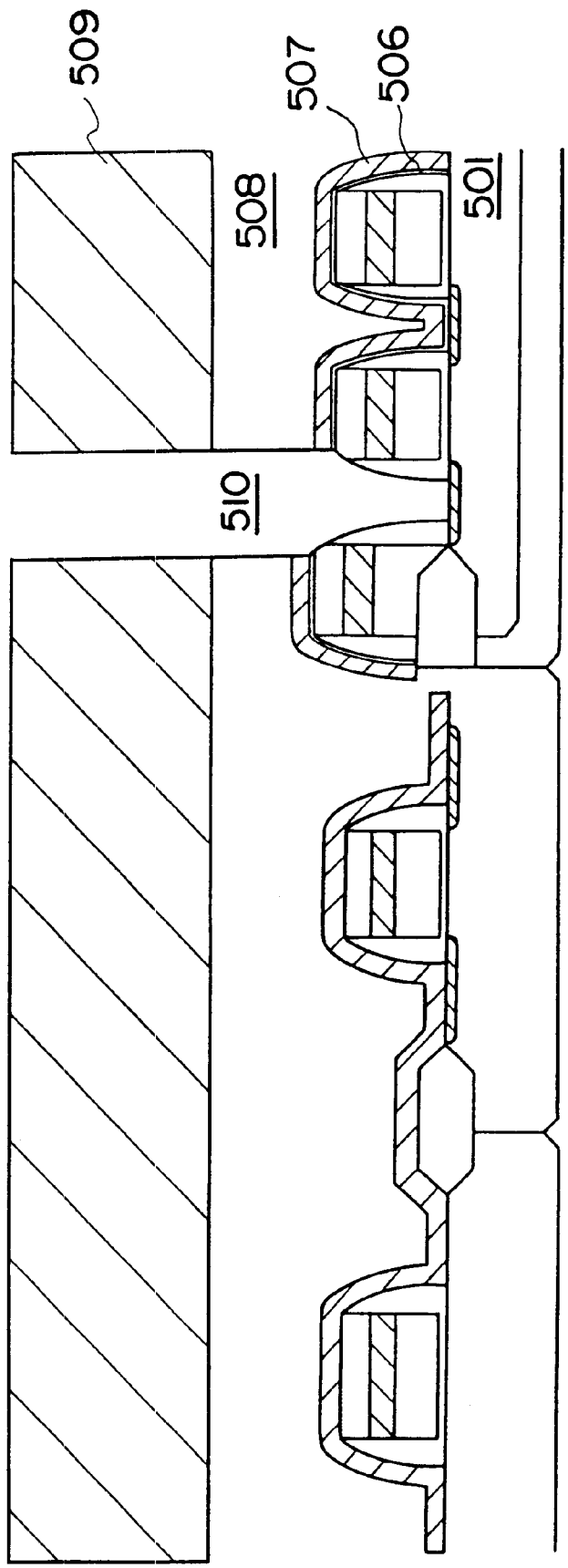
FIG. 22 is an explanatory view of the manufacturing method available in the prior art.

(k) As shown in FIG. 16, side walls (not shown) are formed by depositing a silicon nitride film and etching it in an anisotropic manner, for example, by utilizing the parallel plate etching system under conditions where the pressure=1500 mTorr, the reaction gas flow rate Ar/$CHF_3$/$CF_4$=1000/30/35 cc/min, the RF power=800 W, and the electrode temperature=0° C. Subsequently, after a silicon oxide film (not shown) is deposited and planarized by CMP, a silicon oxide film is etched with hydrogen fluoride aqueous solution until the silicon nitride film 419 and side walls are exposed. Then, after an organic film 423 consisting of SWK-EX2 (a trade name, manufactured by TOKYO OHKA KOGYO) is formed by dispensing, boron is implanted into the silicon nitride film 419 and the side walls by I/I. The thickness of the organic film 423 and the accelerating energy of boron ions are set, respectively, in such a way that the resistance of the bit line and the characteristics of the transfer gates are not affected (for example, the thickness of the organic film=0.20 μm, and the ion accelerating energy=50 keV). (l) As shown in FIG. 17, a contact hole 426 is opened on a pad 413 firstly by depositing a silicon oxide film 424 and forming a contact hole pattern 425 that opens on the pad 413 by conventional lithography, and then, by etching silicon oxide films 424 and 414 using the silicon nitride film 419 and side wall 421 as a stopper, which utilizes, for example, the magnetron etching system under conditions where the pressure=40 mTorr, the reaction gas flow rate $C_4F_8$/Ar/CO=9/200/150 cc/min, the RF power=1300 W, the chiller He backpressure center/edge=3/45 Torr, the gap between electrodes=27 mm, and the electrode temperature=30° C.

Hereinafter, a semiconductor device is manufactured by conducting sequentially the process after the forming of a capacitor electrode in accordance with the conventional manufacturing process of a semiconductor device.

In accordance with the sixth embodiment, as boron is implanted into the silicon nitride film in the step where the contact hole is opened in a self-aligned manner using the silicon nitride film as a stopper, which exists along the bit line and on the side walls of the bit line, in relation to the pad electrically connected to the silicon substrate existing below the bit line, the high selectivity of silicon oxide for silicon nitride can be compatible with the workability of the fine contact hole, thereby enabling the stable processing of the step. The same can be said when other scavenger atoms of boron are used.

As described above, in accordance with the present invention, the selectivity of silicon oxide for silicon nitride can be compatible with the workability of the fine contact hole with a high aspect ratio. Therefore, a technique corresponding to a semiconductor with a microstructure and a high aspect ratio is provided for etching a silicon oxide film using a silicon nitride as a stopper so that a contact hole is opened in a self-aligned manner, etc.

What is claimed is:

1. A method of manufacturing a semiconductor device, comprising the steps of:

forming a silicon nitride film on a silicon substrate on which circuit patterns are formed;

forming a silicon oxide film on said silicon nitride film;

conducting a planarization processing;

etching said silicon oxide film so as to expose a portion of said silicon nitride film, wherein said silicon nitride film is an etching stopper;

ion implanting, into said silicon nitride film, one or more kinds of atoms selected from the group consisting of carbon atoms and atoms whose reactivity to fluorine and oxygen is equivalent to that of carbon;

forming a mask pattern;

patterning said silicon nitride film, into which one or more kinds of atoms have been implanted, by using said mask pattern as an etching mask; and etching said silicon oxide film by using said patterned silicon nitride film as an etching mask, wherein the implantation of said atoms of one or more kinds into said silicon nitride film is conducted not only after the silicon oxide film has been deposited on the silicon nitride film for planarization, but also after the silicon oxide film has been etched with sufficiently high selectivity of silicon oxide for silicon nitride until the silicon nitride film on transfer gates has been exposed.

2. The method according to claim 1, wherein said atoms whose reactivity to fluorine and oxygen is equivalent to that of carbon are selected from the group consisting of boron, phosphorus, arsenic, and antimony.

3. The method according to claim 2, wherein said ion implanting step is conducted under the condition that the implantation dose of said atoms, which go beyond said silicon nitride film and reach a portion situated below said silicon nitride film, must be below the level at which the transistor characteristics of that portion are affected.

4. The method according to claim 3, wherein the implantation of said atoms of one or more kinds into said silicon nitride film is conducted not only after a silicon oxide film has been deposited on the silicon nitride film for planarization, but after the silicon oxide film has been etched with sufficiently high selectivity of silicon oxide for silicon nitride until the silicon nitride film on transfer gates has been exposed.

5. The method according to claim 4, wherein the implantation of said atoms of one or more kinds into said silicon nitride film is conducted after an organic film is formed on said silicon nitride film.

6. The method according to claim 5, wherein the implantation of said atoms of one or more kinds into said silicon nitride film is conducted when a wafer having said silicon nitride film is inclined at a wider angle than the apparent angle of the incident ions viewed from said silicon nitride film.

7. The method according to claim 6, wherein said ion implanting step further comprises ionization sputtering, and said one or more kinds of atoms are selected from the group consisting of boron and carbon.

8. The method according to claim 4, wherein the implantation of said atoms of one or more kinds into said silicon nitride film is conducted when a wafer having said silicon nitride film is inclined at a wider angle than the apparent angle of the incident ions viewed from said silicon nitride film.

9. The method according to claim 8, wherein said ion implanting step further comprises ionization sputtering, and said one or more kinds of atoms are selected from the group consisting of boron and carbon.

10. The method according to claim 4, wherein said ion implanting step further comprises ionization sputtering, and said one or more kinds of atoms are selected from the group consisting of boron and carbon.

11. The method according to claim 3, wherein the implantation of said atoms of one or more kinds into said silicon nitride film is conducted after an organic film is formed on said silicon nitride film.

12. The method according to claim 11, wherein the implantation of said atoms of one or more kinds into said silicon nitride film is conducted when a wafer having said silicon nitride film is inclined at a wider angle than the apparent angle of the incident ions viewed from said silicon nitride film.

13. The method according to claim 12, wherein said ion implanting step further comprises ionization sputtering, and said one or more kinds of atoms are selected from the group consisting of boron and carbon.

14. The method according to claim 3, wherein said ion implanting step further comprises ionization sputtering, and said one or more kinds of atoms are selected from the group consisting of boron and carbon.

15. The method according to claim 1, wherein said etching process is for forming a contact hole.

16. The method according to claim 15, wherein said semiconductor device includes a plurality of transfer gates, and said contact hole is formed between said transfer gates.

17. A method of manufacturing a semiconductor device, comprising the steps of:

forming a silicon nitride film on a silicon substrate on which circuit patterns are formed;

forming a silicon oxide film on said silicon nitride film;

conducting a planarization processing;

etching said silicon oxide film so as to expose a portion of said silicon nitride film;

forming an organic film on said silicon oxide film and said silicon nitride film;

ion implanting, into said silicon nitride film, one or more kinds of atoms selected from the group consisting of carbon atoms and atoms whose reactivity to fluorine and oxygen is equivalent to that of carbon;

removing the organic film; and etching said silicon oxide film by using said silicon nitride film as an etching stopper, wherein the implantation of said atoms of one or more kinds into said silicon nitride film is conducted when a wafer having said silicon nitride film is inclined at a wider angle than the apparent angle of the incident ions viewed from said silicon nitride film and is conducted not only after the silicon oxide film has been deposited on the silicon nitride film for planarization, but also after the silicon oxide film has been etched with sufficiently high selectivity of silicon oxide for silicon nitride until the silicon nitride film on transfer gates has been exposed.

18. The method according to claim 17, wherein said ion implanting step further comprises ionization sputtering, and said one or more kinds of atoms are selected from the group consisting of boron and carbon.

19. The manufacturing method according to claim 17, wherein said atoms whose reactivity to fluorine and oxygen is equivalent to that of carbon are atoms selected from a group consisting of boron, phosphorous, arsenic, and antimony.

20. The manufacturing method according to claim 17, wherein the implantation of said atoms of one or more kinds into said silicon nitride film is conducted under the condition that the implantation dose of said atoms, which go beyond said silicon nitride film, and reach a portion situated below said silicon nitride film, must be below the level at which the characteristics of that portion are affected.

21. A method of manufacturing a semiconductor device, comprising the steps of:

depositing a silicon nitride film on a silicon substrate on which circuit patterns are formed;

depositing a silicon oxide film on said silicon nitride film;

conducting a planarization processing;

etching said silicon oxide film so as to expose a portion of said silicon nitride film;

forming an organic film on said silicon oxide film and said silicon nitride film;

ion implanting, into said silicon nitride film, one or more kinds of atoms selected from the group consisting of carbon atoms and atoms whose reactivity to fluorine and oxygen is equivalent to that of carbon;

removing the organic film; and etching said silicon oxide film by using said silicon nitride film as an etching stopper, wherein the implantation of said atoms of one or more kinds into said silicon nitride film is conducted not only after a silicon oxide film has been deposited on the silicon nitride film for planarization, but also after the silicon oxide film has been etched with sufficiently high selectivity of silicon oxide for silicon nitride until the silicon nitride film on transfer gates has been exposed.

* * * * *